(12) United States Patent
Wang et al.

(10) Patent No.: US 12,376,338 B2
(45) Date of Patent: Jul. 29, 2025

(54) SEMICONDUCTOR DEVICE STRUCTURE WITH DIELECTRIC DUMMY GATE AND METHOD FOR FORMING THE SAME

(71) Applicant: Taiwan Semiconductor Manufacturing Company, Ltd., Hsinchu (TW)

(72) Inventors: Sheng-Hsiung Wang, Zhubei (TW); Tung-Heng Hsieh, Zhudong Town (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 616 days.

(21) Appl. No.: 17/673,503

(22) Filed: Feb. 16, 2022

(65) Prior Publication Data

US 2023/0261076 A1    Aug. 17, 2023

(51) Int. Cl.
| | | |
|---|---|---|
| *H10D 64/00* | (2025.01) | |
| *H10D 30/01* | (2025.01) | |
| *H10D 30/67* | (2025.01) | |
| *H10D 62/10* | (2025.01) | |
| *H10D 64/01* | (2025.01) | |

(52) U.S. Cl.
CPC ....... *H10D 30/6735* (2025.01); *H10D 30/031* (2025.01); *H10D 30/6757* (2025.01); *H10D 62/119* (2025.01); *H10D 64/017* (2025.01); *H10D 64/018* (2025.01)

(58) Field of Classification Search
CPC ......... H01L 29/42392; H01L 29/66545; H01L 21/823412; H01L 21/823437; H01L 29/165; H01L 29/0669; B82Y 10/00
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0200738 A1* | 7/2017 | Kim ..................... H10D 30/014 |

* cited by examiner

*Primary Examiner* — Jay C Kim
*Assistant Examiner* — Joshua Scott Wyatt
(74) *Attorney, Agent, or Firm* — Birch, Stewart, Kolasch & Birch, LLP

(57) ABSTRACT

A semiconductor device structure is provided. The semiconductor device structure includes a substrate having a base and a fin over the base. The fin has a wide portion and a width-transition portion. The width-transition portion tapers away from the wide portion in a top view of the substrate, and a first top surface of the wide portion is higher than a second top surface of the width-transition portion. The semiconductor device structure includes a gate stack wrapped around the wide portion. The semiconductor device structure includes a dielectric dummy gate wrapped around the width-transition portion.

20 Claims, 45 Drawing Sheets

SEMICONDUCTOR DEVICE STRUCTURE WITH DIELECTRIC DUMMY GATE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advances to be realized, similar developments in IC processing and manufacturing are needed.

One development in the scaling down process is the use of fin-type field effect transistors (FinFETs). It is desired to further improve the operation of FinFETs, such as by using a gate all around (GAA) transistor structure to increase the efficiency of gate control over the transistor channel.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 2A-1 to 2J-1 are cross-sectional views illustrating the semiconductor device structure along a sectional line I-I' in FIGS. 2A-2J, in accordance with some embodiments.

FIGS. 2A-2 to 2J-2 are cross-sectional views illustrating the semiconductor device structure along a sectional line II-II' in FIGS. 2A-2J, in accordance with some embodiments.

FIGS. 2A-3 to 2J-3 are cross-sectional views illustrating the semiconductor device structure along a sectional line in FIGS. 2A-2J, in accordance with some embodiments.

FIG. 2G-4 is a cross-sectional view illustrating the semiconductor device structure along a sectional line IV-IV' in FIG. 2G, in accordance with some embodiments.

FIG. 2J-4 is a cross-sectional view illustrating the semiconductor device structure along a sectional line IV-IV' in FIG. 2J, in accordance with some embodiments.

FIG. 2J-5 is a cross-sectional view illustrating the semiconductor device structure along a sectional line V-V' in FIG. 2J, in accordance with some embodiments.

FIG. 2J-6 is a cross-sectional view illustrating the semiconductor device structure along a sectional line VI-VI' in FIG. 2J, in accordance with some embodiments.

FIG. 2J-7 is a perspective view of the semiconductor device structure of FIG. 2J, in accordance with some embodiments.

DETAILED DESCRIPTION

Figure 1A:
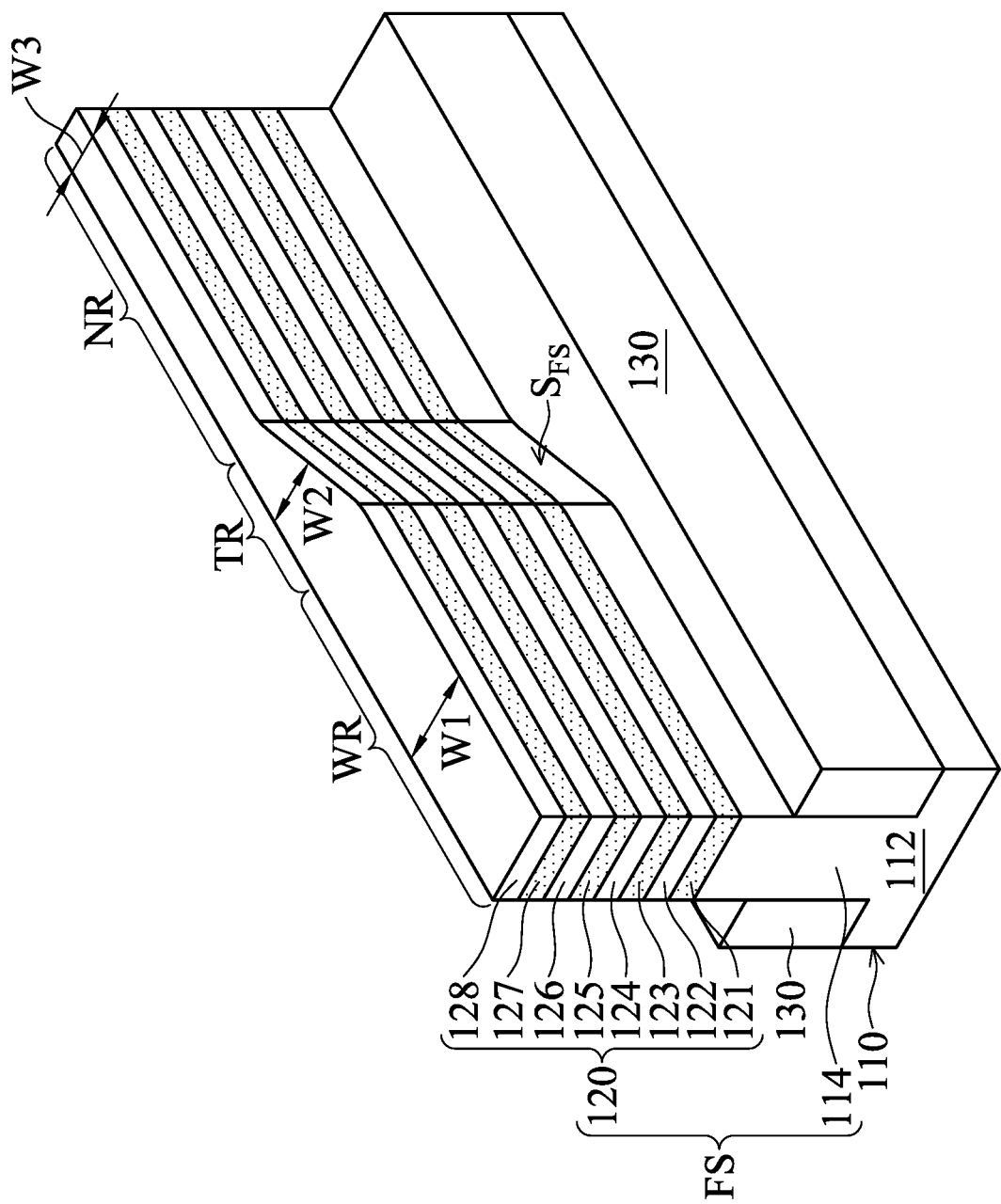
FIGS. 1A-1B are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
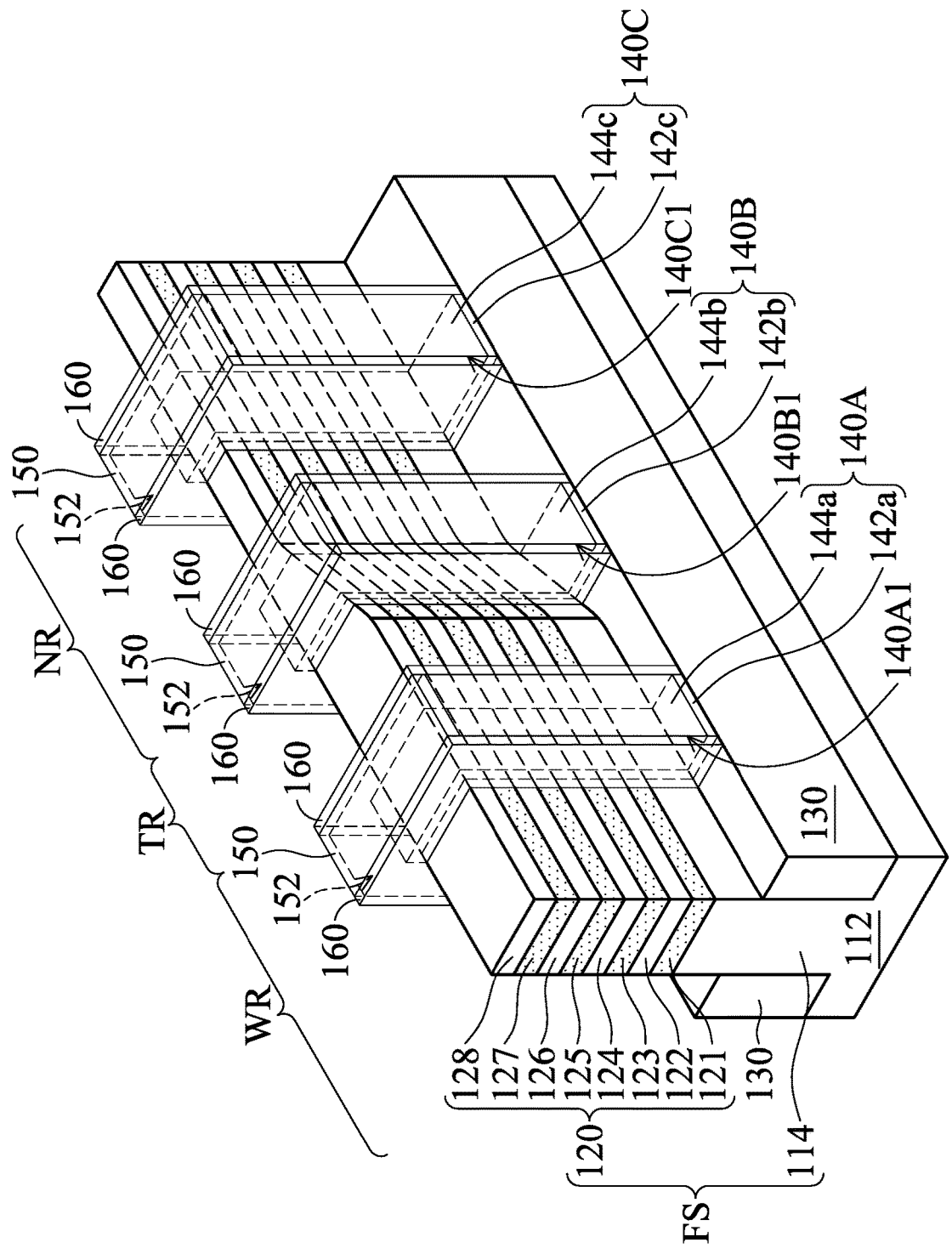

FIGS. 1A-1B are perspective views of various stages of a process for forming a semiconductor device structure, in accordance with some embodiments. As shown in FIG. 1A, a substrate 110 is provided, in accordance with some embodiments. The substrate 110 has a base 112 and a fin FS over the base 112, in accordance with some embodiments.

The base 112 includes, for example, a semiconductor substrate. The base 112 includes, for example, a semiconductor wafer (such as a silicon wafer) or a portion of a semiconductor wafer. In some embodiments, the base 112 is made of an elementary semiconductor material including silicon or germanium in a single crystal structure, a polycrystal structure, or an amorphous structure.

In some other embodiments, the base 112 is made of a compound semiconductor, such as silicon carbide, gallium arsenide, gallium phosphide, indium phosphide, indium arsenide, an alloy semiconductor, such as SiGe or GaAsP, or a combination thereof. The base 112 may also include multi-layer semiconductors, semiconductor on insulator (SOI) (such as silicon on insulator or germanium on insulator), or a combination thereof.

In some embodiments, the base 112 is a device wafer that includes various device elements. In some embodiments, the various device elements are formed in and/or over the base 112. The device elements are not shown in figures for the purpose of simplicity and clarity.

Examples of the various device elements include active devices, passive devices, other suitable elements, or a combination thereof. The active devices may include transistors or diodes (not shown) formed at a surface of the base 112. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the base 112. The isolation features are used to surround active regions and electrically isolate various device elements formed in and/or over the base 112 in the active regions. In some embodiments, the isolation features include shallow trench isolation (STI) features, local oxidation of silicon (LOCOS) features, other suitable isolation features, or a combination thereof.

As shown in FIG. 1A, the fin FS has a wide portion WR, a width-transition portion TR, and a narrow portion NR, in accordance with some embodiments. The width-transition portion TR is connected between the wide portion WR and the narrow portion NR, in accordance with some embodiments. The wide portion WR is wider than the narrow portion NR, in accordance with some embodiments.

The width-transition portion TR tapers away from the wide portion WR, in accordance with some embodiments. The width-transition portion TR tapers toward the narrow portion NR, in accordance with some embodiments. The width-transition portion TR has a sloped surface SFs, in accordance with some embodiments.

In some embodiments, an average width W2 of the width-transition portion TR is less than an average width W1 of the wide portion WR. The average width W2 of the width-transition portion TR is greater than an average width W3 of the narrow portion NR, in accordance with some embodiments.

The average width W1 ranges from about 40 nm to about 80 nm, in accordance with some embodiments. The average width W2 ranges from about 2 nm to about 79 nm, in accordance with some embodiments. The average width W3 ranges from about 1 nm to about 20 nm, in accordance with some embodiments. In some embodiments, a difference between the average width W1 and the average width W3 ranges from about 10 nm to about 30 nm.

As shown in FIG. 1A, the fin FS has a bottom part 114 and a nanostructure stack 120, in accordance with some embodiments. The nanostructure stack 120 is over the bottom part 114, in accordance with some embodiments. The bottom part 114 and the base 112 are made of the same material, in accordance with some embodiments. The bottom part 114 is made of an elementary semiconductor material including silicon or germanium in a single crystal structure, a polycrystal structure, or an amorphous structure.

In some other embodiments, the bottom part 114 is made of a compound semiconductor, such as silicon carbide, gallium arsenide, gallium phosphide, indium phosphide, indium arsenide, an alloy semiconductor, such as SiGe or GaAsP, or a combination thereof.

The nanostructure stack 120 includes nanostructures 121, 122, 123, 124, 125, 126, 127, and 128, in accordance with some embodiments. The nanostructures 121, 122, 123, 124, 125, 126, 127, and 128 are sequentially stacked over the bottom part 114, in accordance with some embodiments. The nanostructures 121, 122, 123, 124, 125, 126, 127, and 128 include nanowires or nanosheets, in accordance with some embodiments.

The nanostructures 121, 123, 125, and 127 are all made of the same first material, in accordance with some embodiments. The first material is different from the material of the bottom part 114 or the base 112, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122, 124, 126, and 128 are all made of the same second material, in accordance with some embodiments. The second material is different from the first material, in accordance with some embodiments. The second material is the same as the material of the bottom part 114 or the base 112, in accordance with some embodiments. The second material includes an elementary semiconductor material including silicon or germanium in a single crystal structure, a polycrystal structure, or an amorphous structure, in accordance with some embodiments.

The second material includes a compound semiconductor, an alloy semiconductor, or a combination thereof, in accordance with some embodiments. The compound semiconductor includes silicon carbide, gallium arsenide, gallium phosphide, indium phosphide, indium arsenide, a combination thereof, or another suitable compound semiconductor material, in accordance with some embodiments. The alloy semiconductor includes SiGe, SiGeSn, SiGeC, SiSn, GaAsP, GeSn, a combination thereof, or another suitable alloy semiconductor material, in accordance with some embodiments.

As shown in FIG. 1A, an isolation layer 130 is formed over the base 112, in accordance with some embodiments. The fin FS is partially embedded in the isolation layer 130, in accordance with some embodiments. The fin FS is surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

Figure 2A:
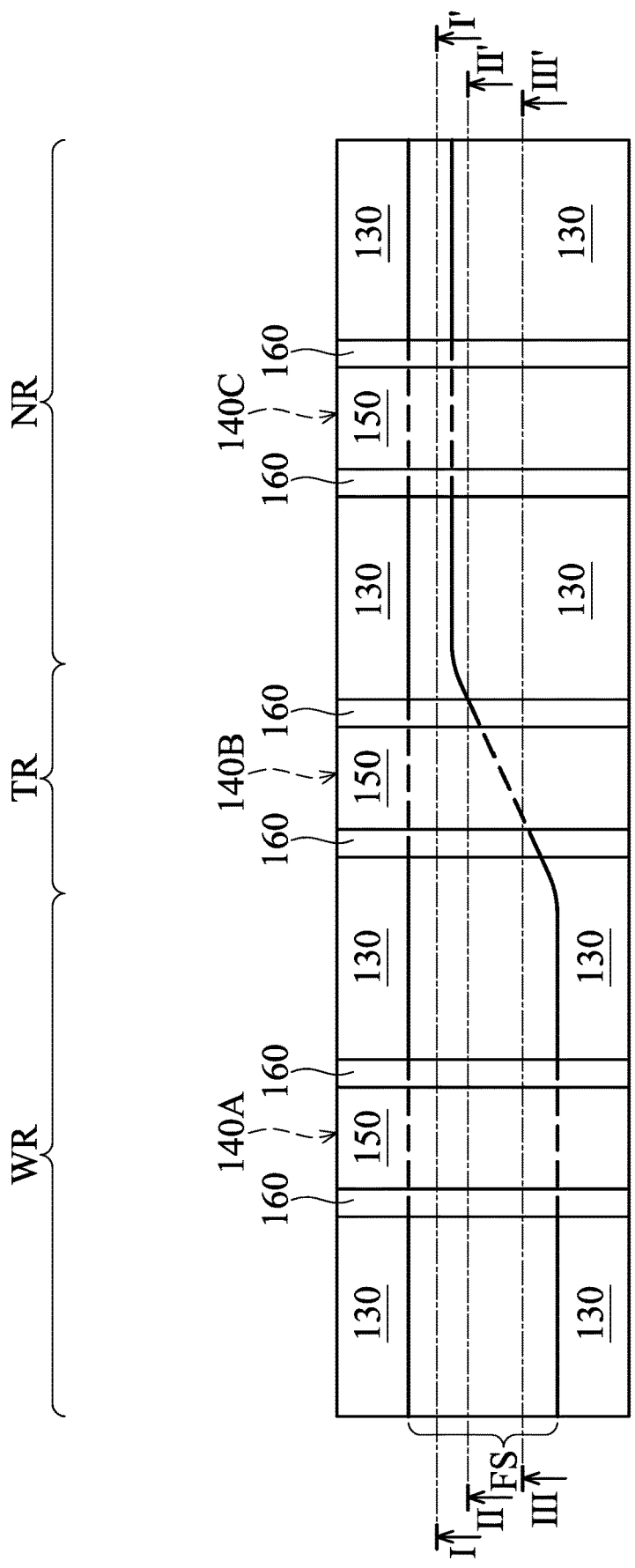
FIGS. 2A-2J are top views of various stages of a process for forming a semiconductor device structure, in accordance with some embodiments.
Figures 1, 2A:
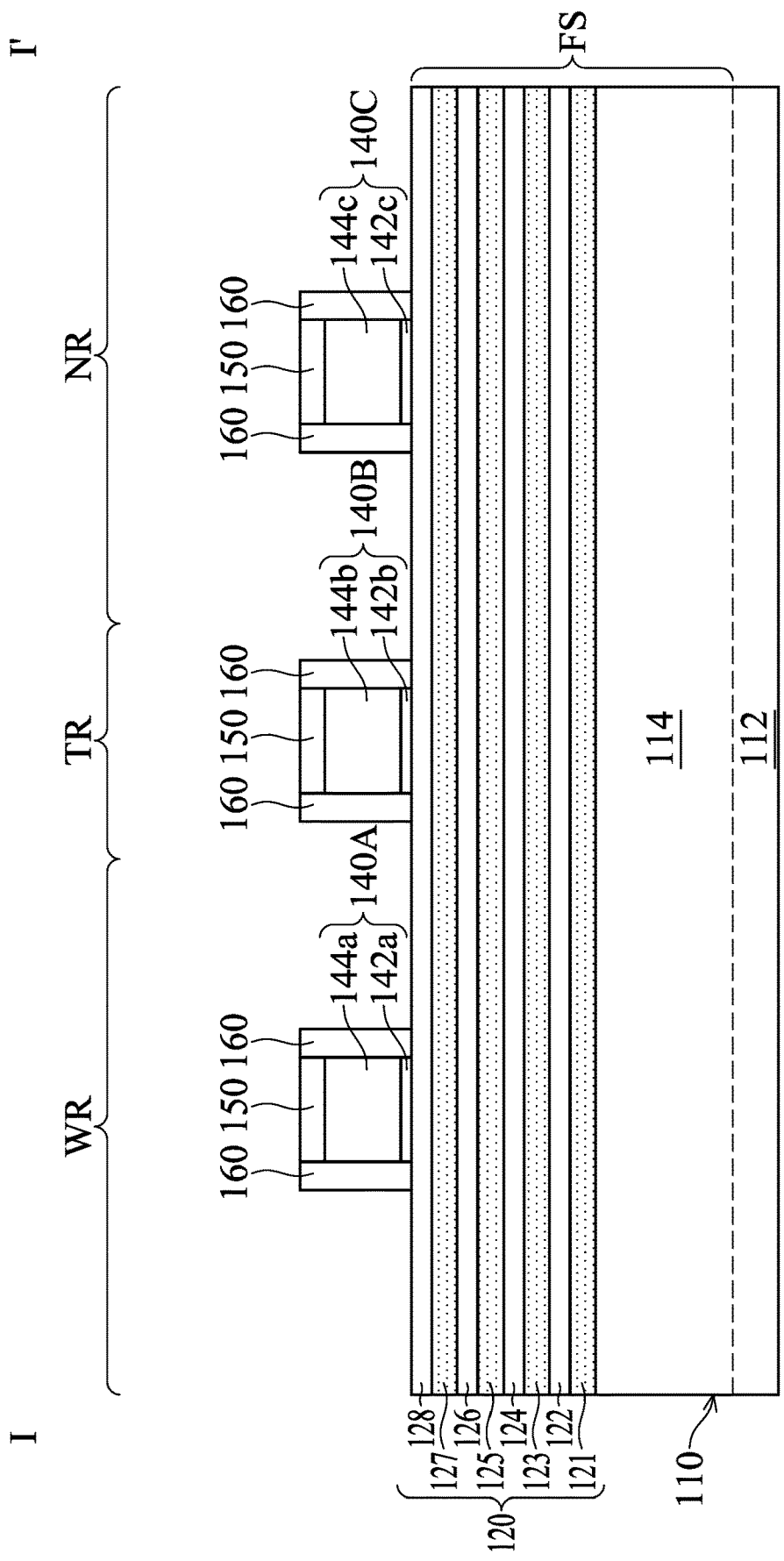

FIG. 2A is a top view of the semiconductor device structure of FIG. 1B, in accordance with some embodiments. FIGS. 2A-2J are top views of various stages of a process for forming a semiconductor device structure, in accordance with some embodiments. FIGS. 2A-1 to 2J-1 are cross-sectional views illustrating the semiconductor device structure along a sectional line I-I' in FIGS. 2A-2J, in accordance with some embodiments.

Figures 2, 2A:
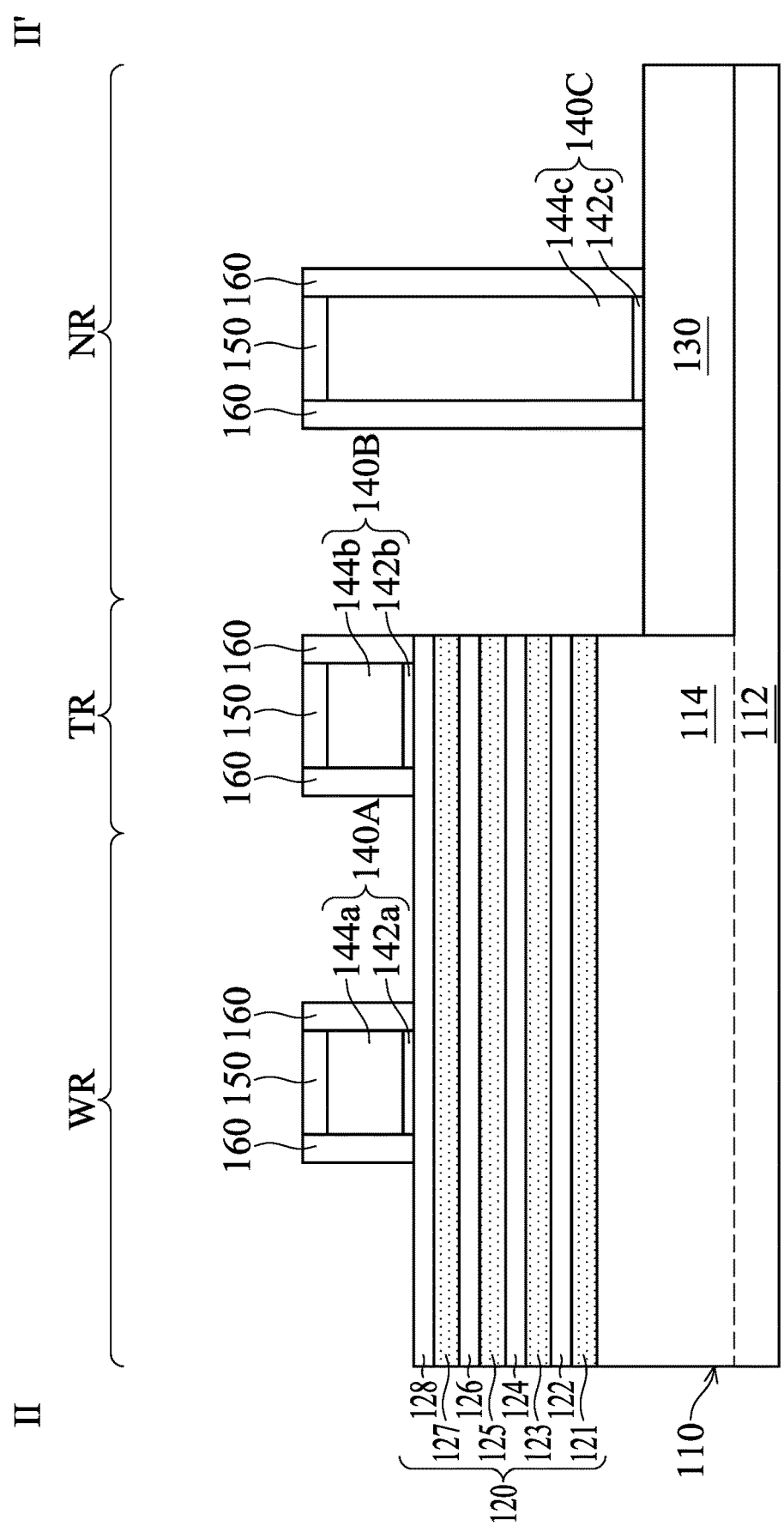
Figures 2, 2A, 3:
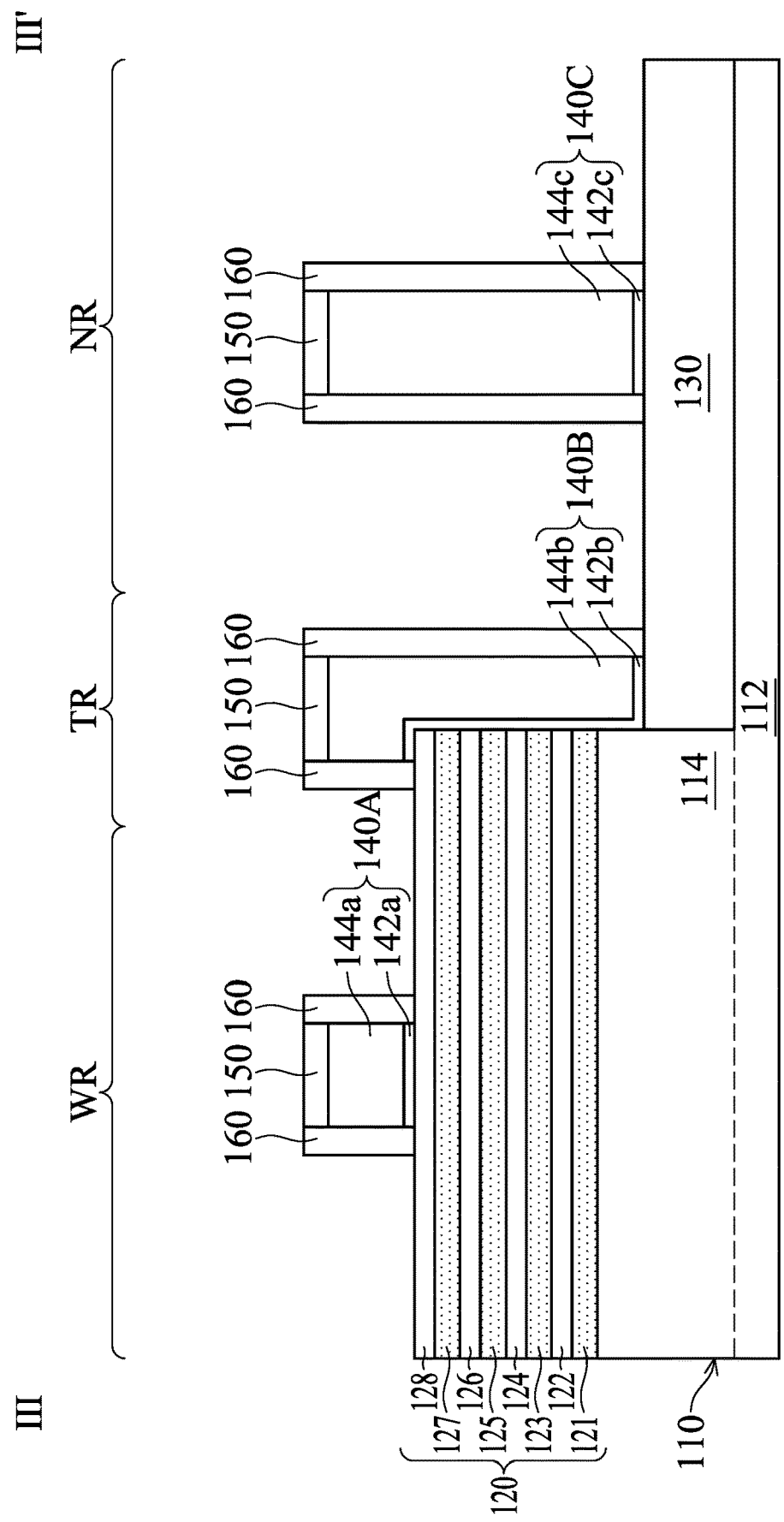
Figure 2B:
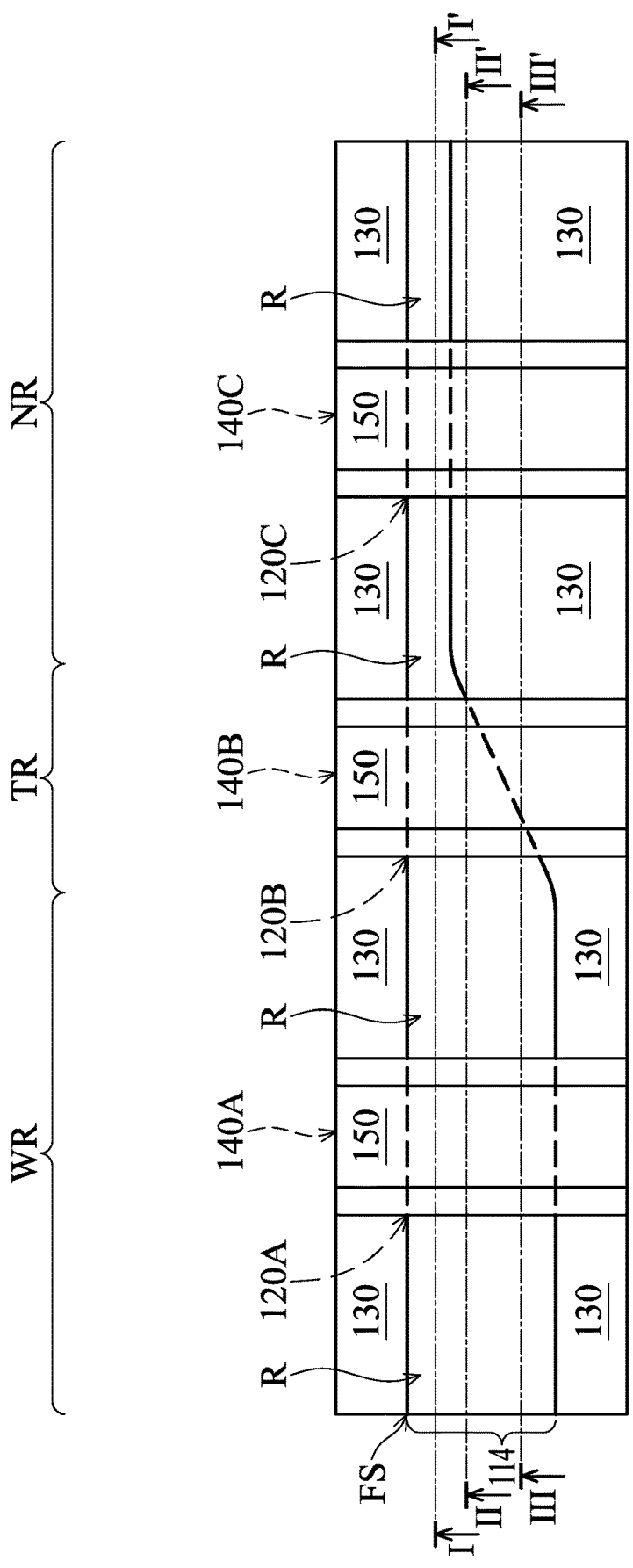
Figures 1, 2B:
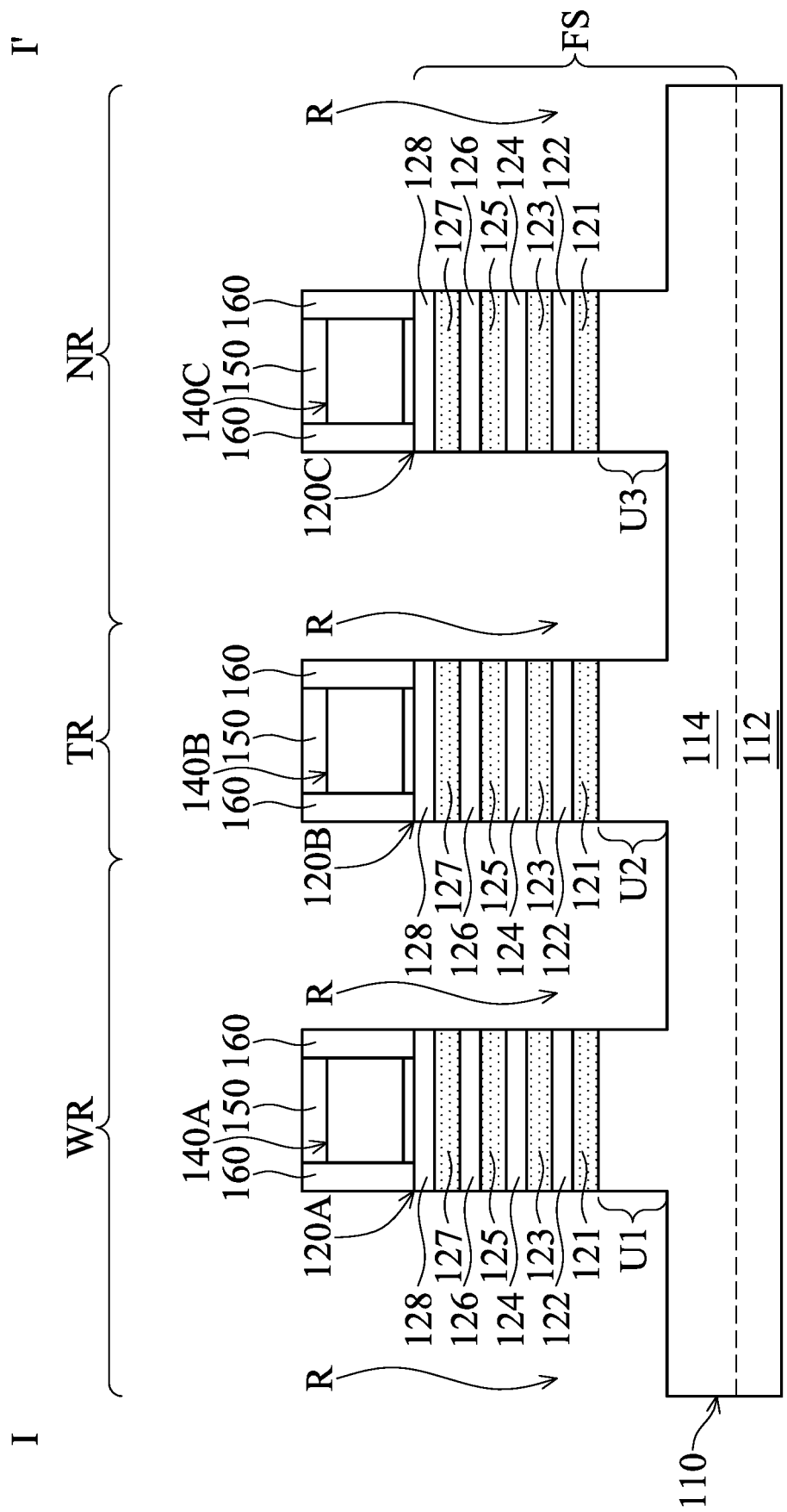
Figures 2, 2B:
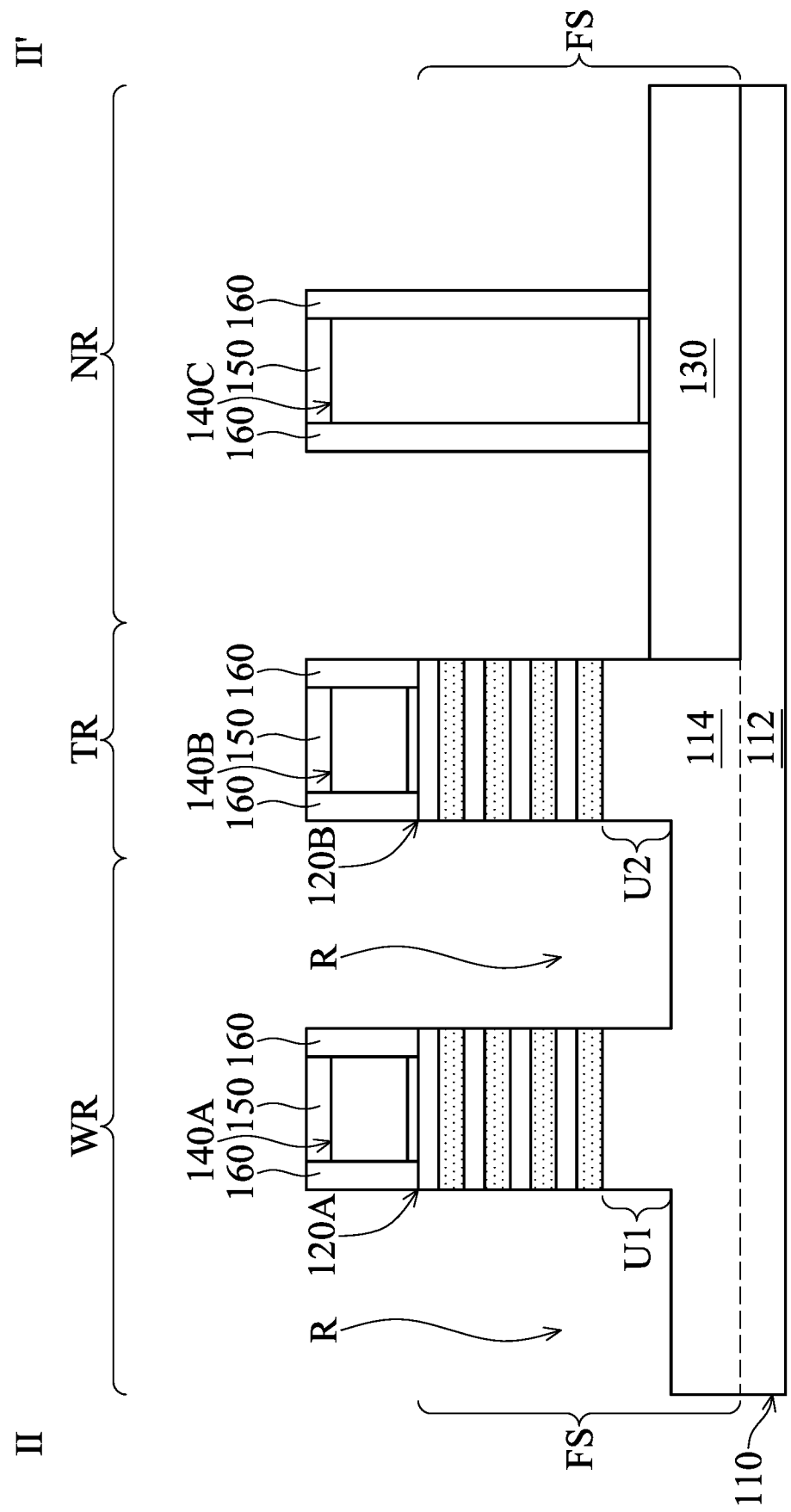
Figures 2, 2B, 3:
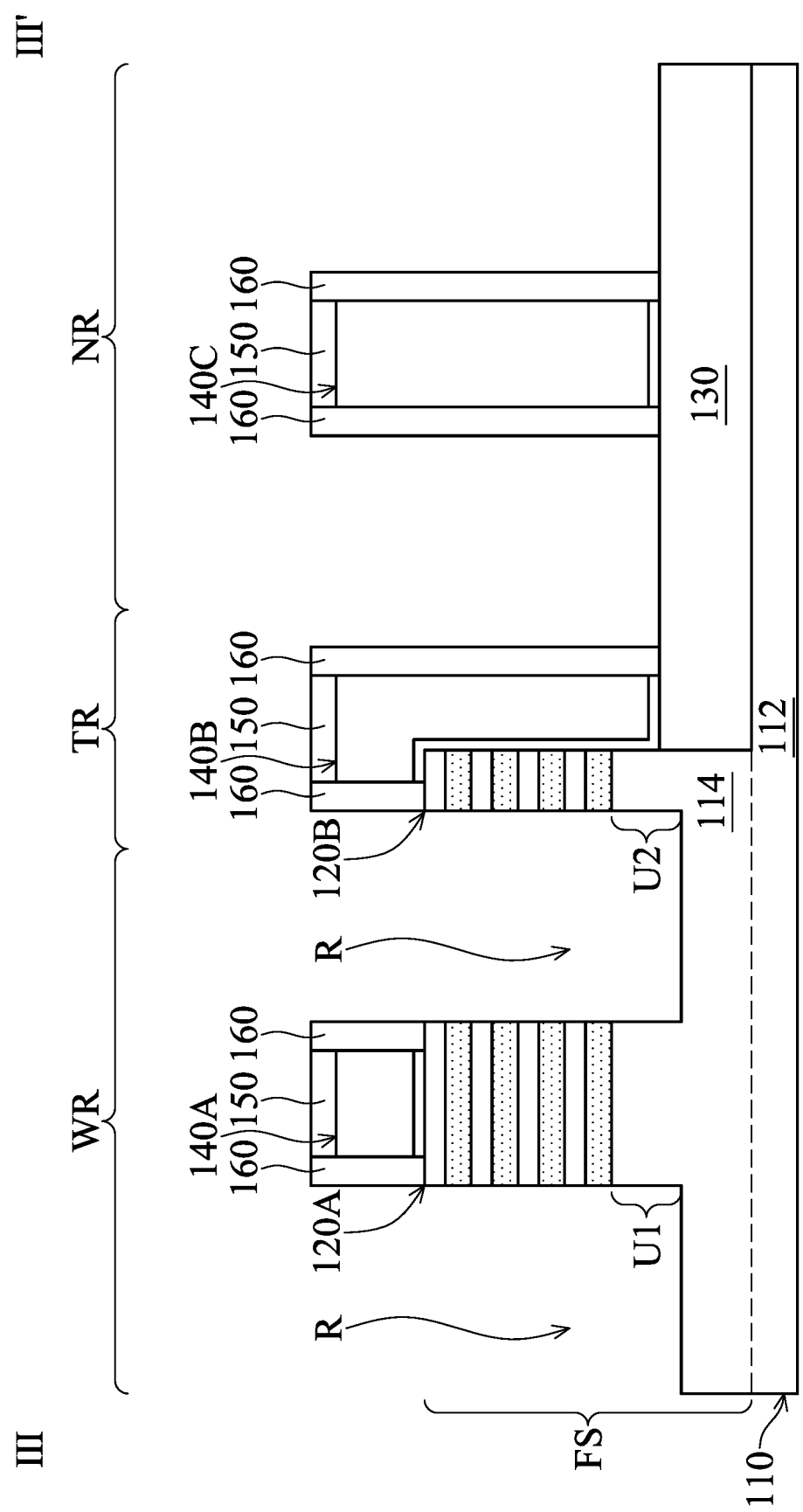
Figure 2C:
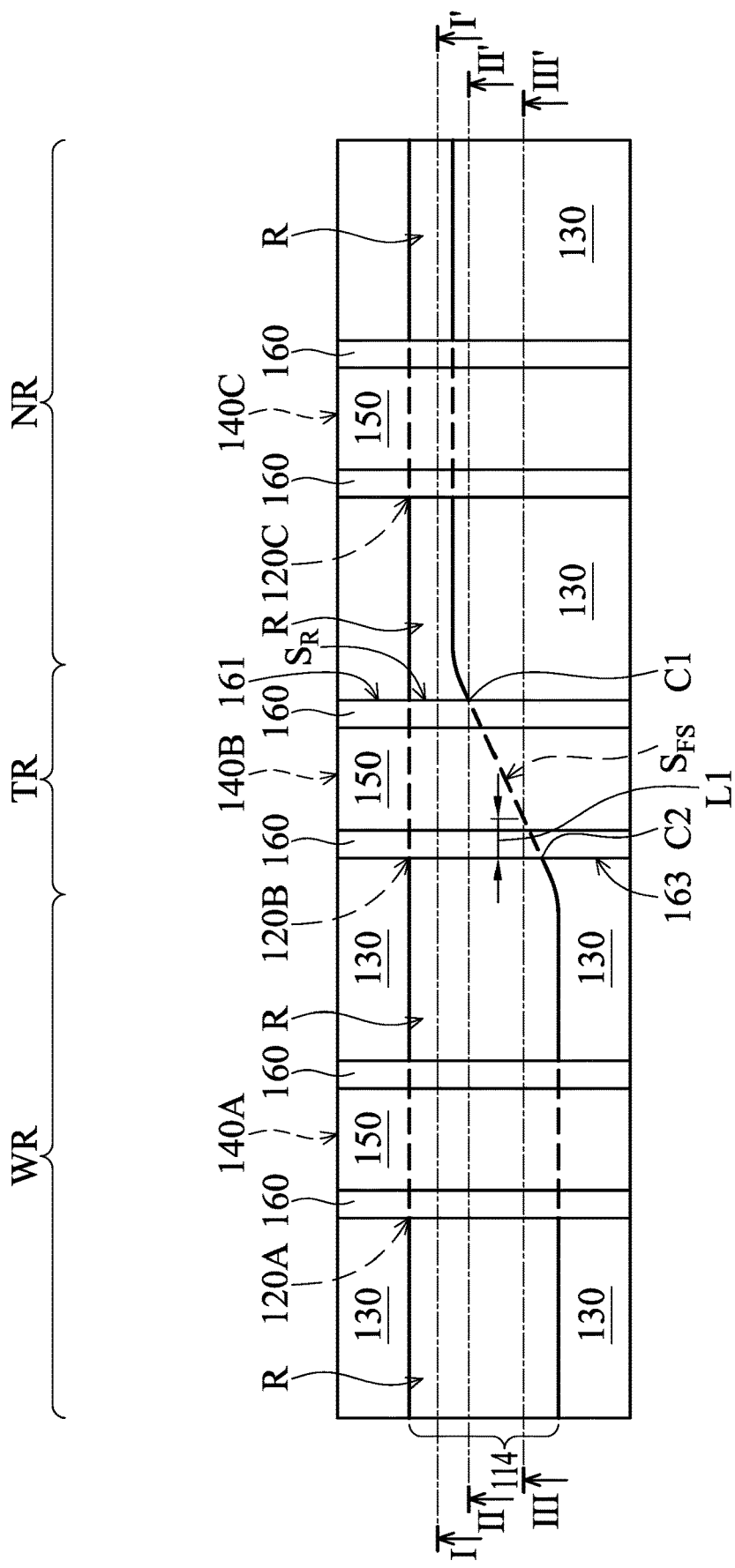
Figures 1, 2C:
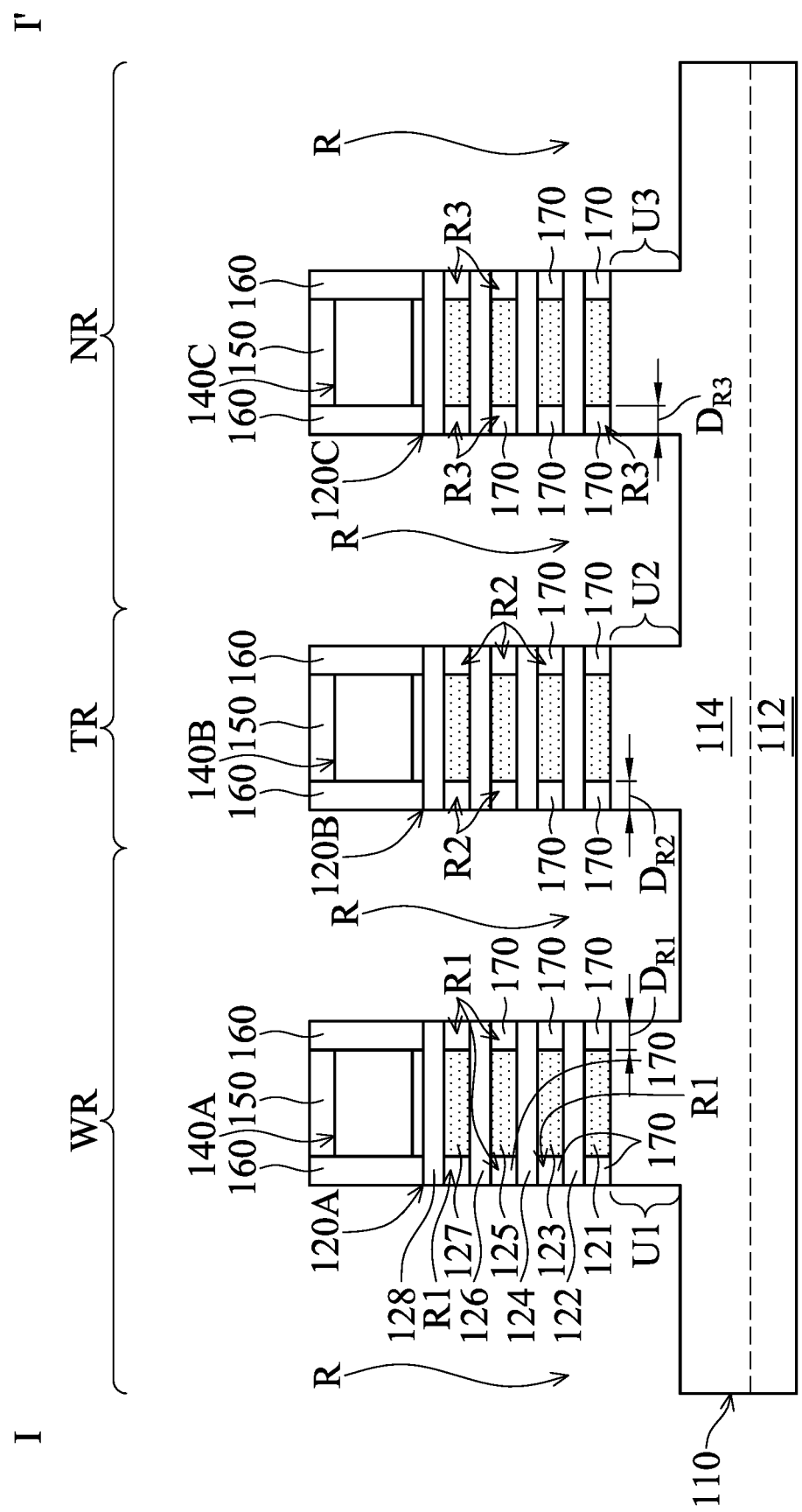
Figures 2, 2C:
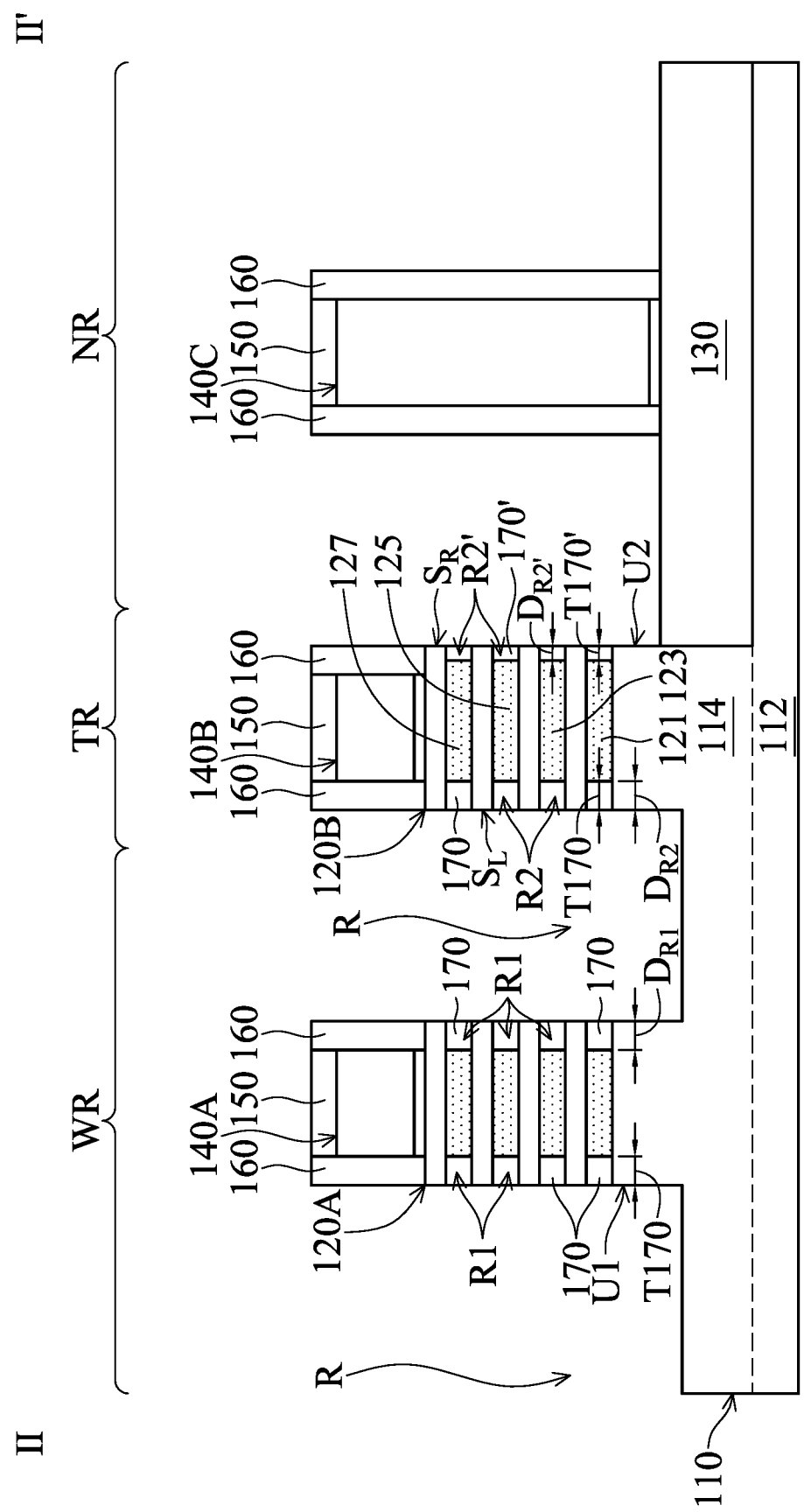
Figures 2, 2C, 3:
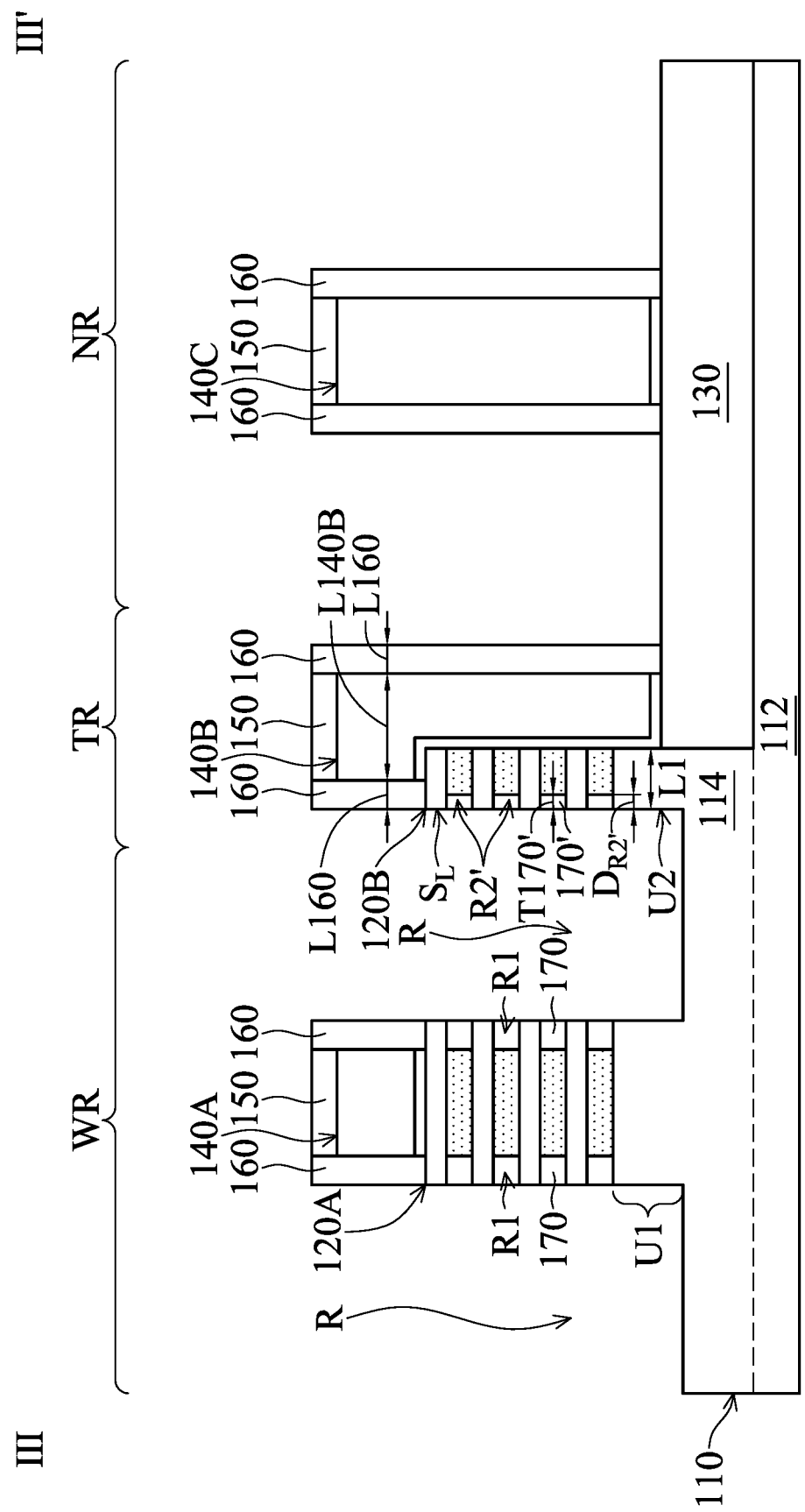
Figure 2D:
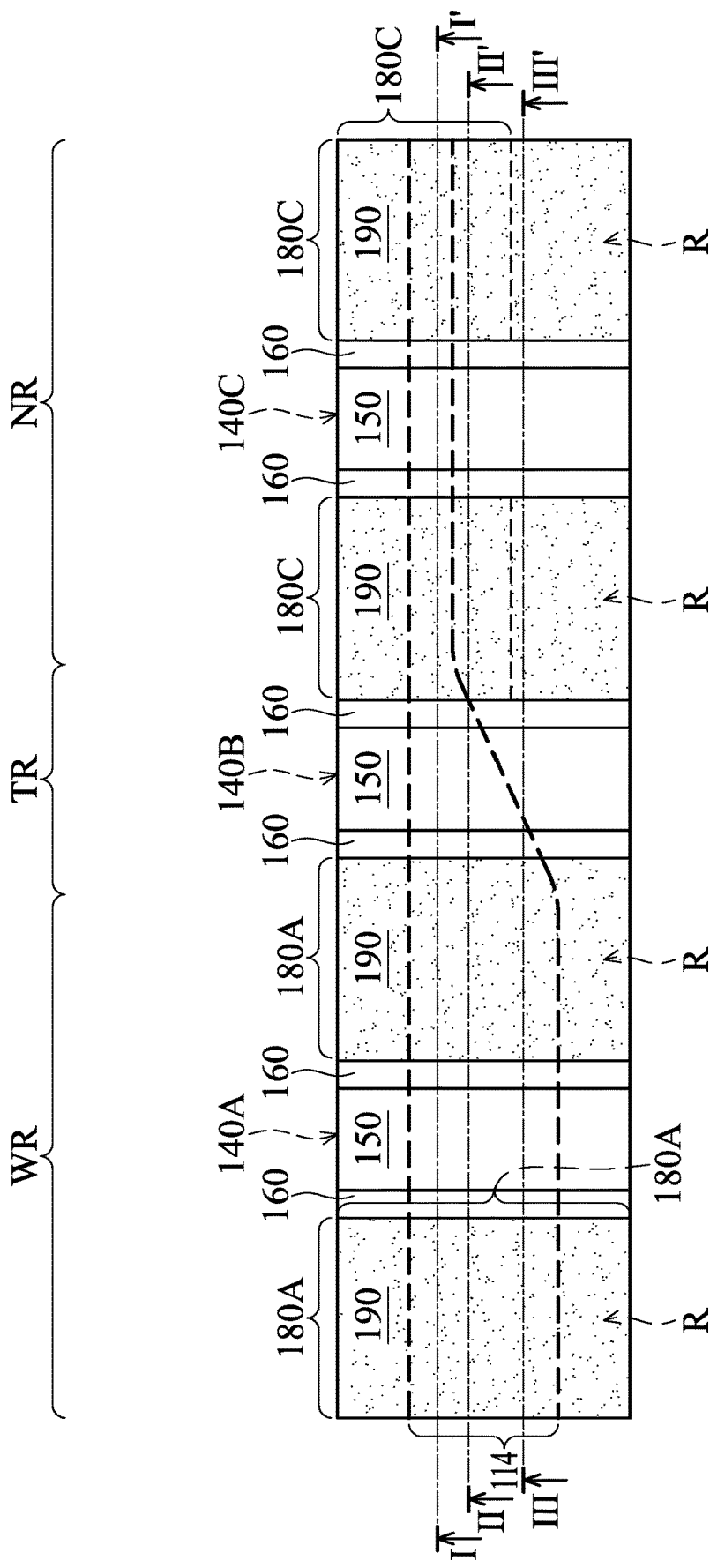
Figures 1, 2D:
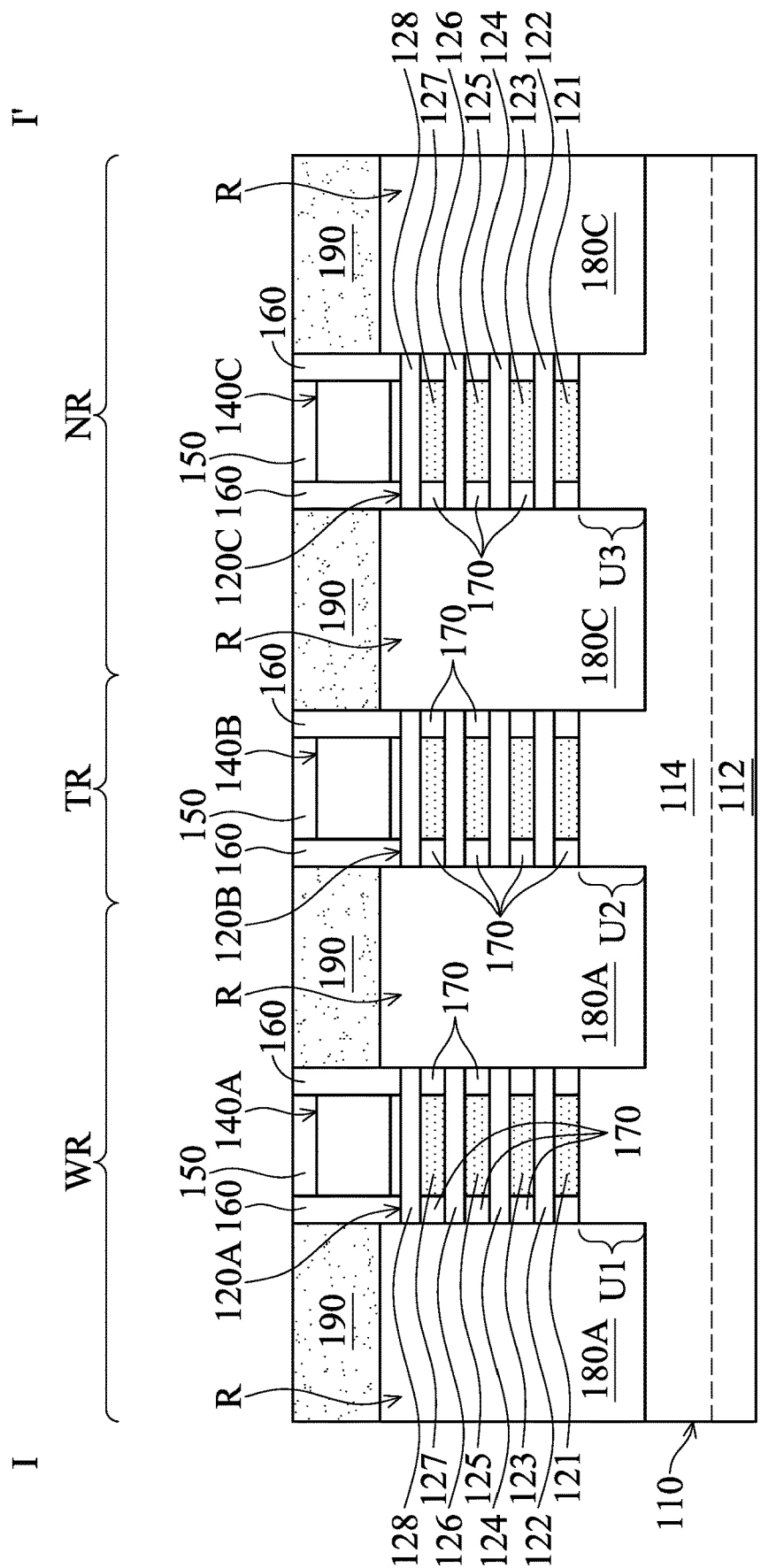
Figures 2, 2D:
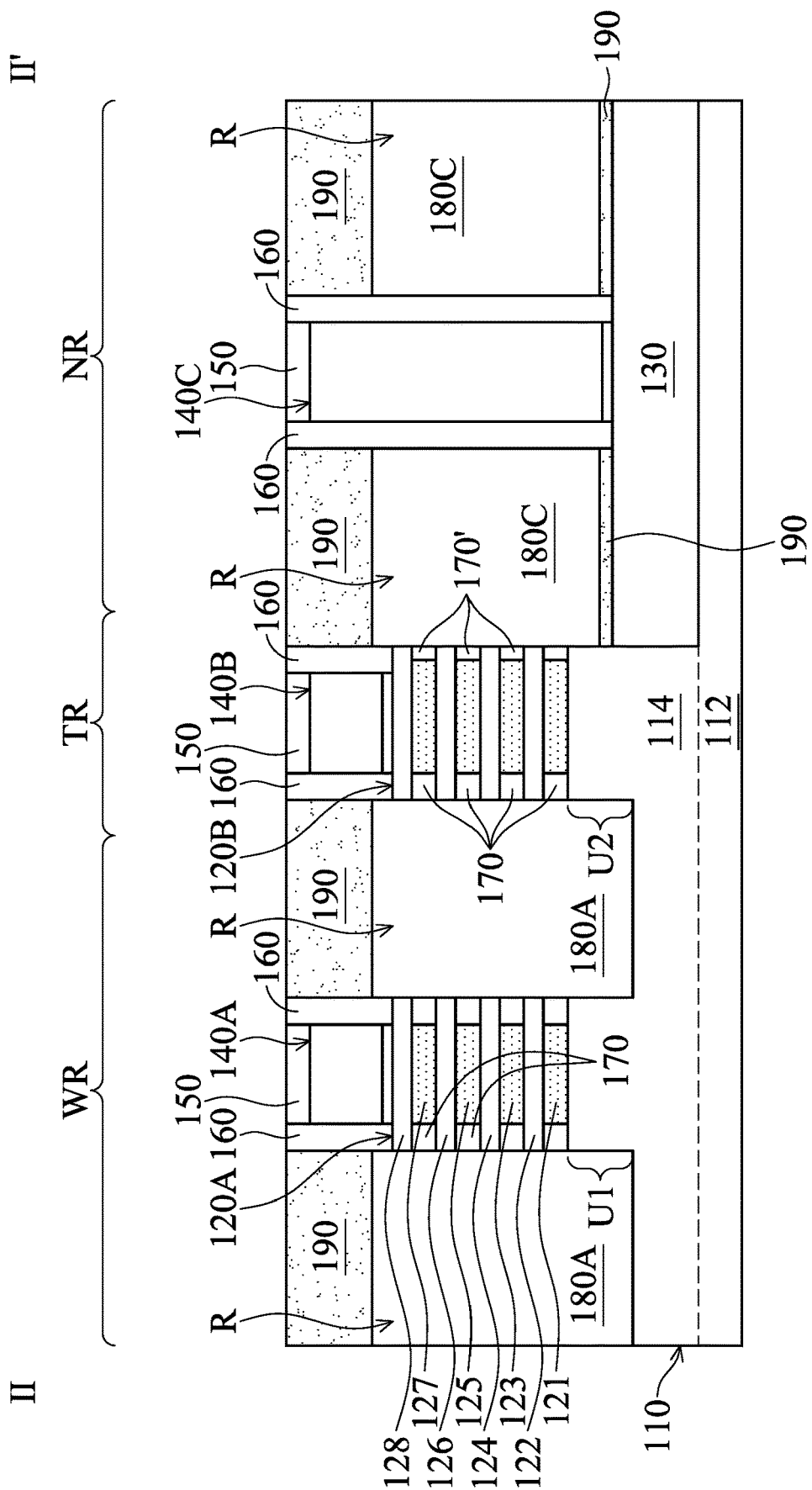
Figures 2, 2D, 3:
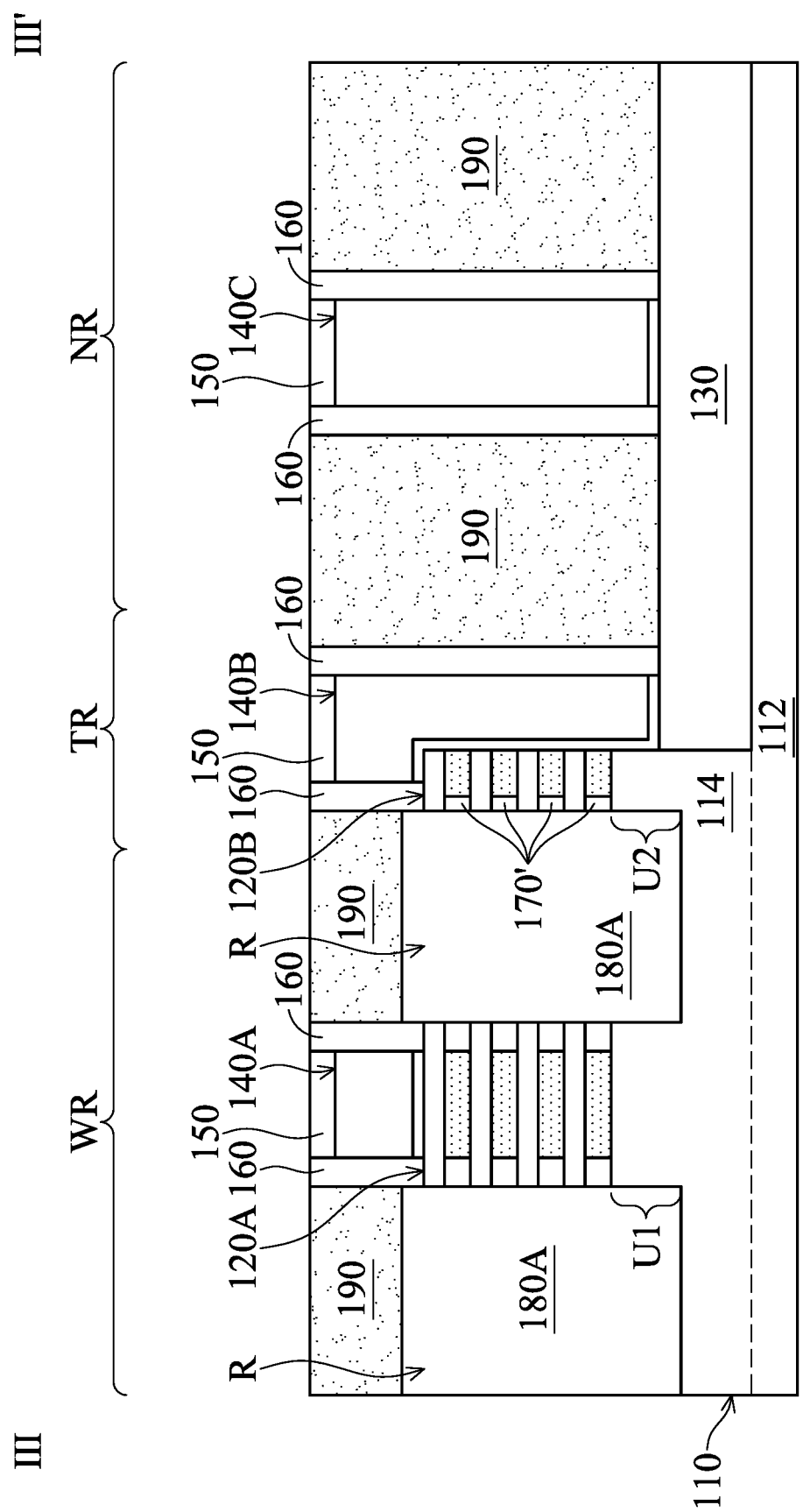
Figure 2E:
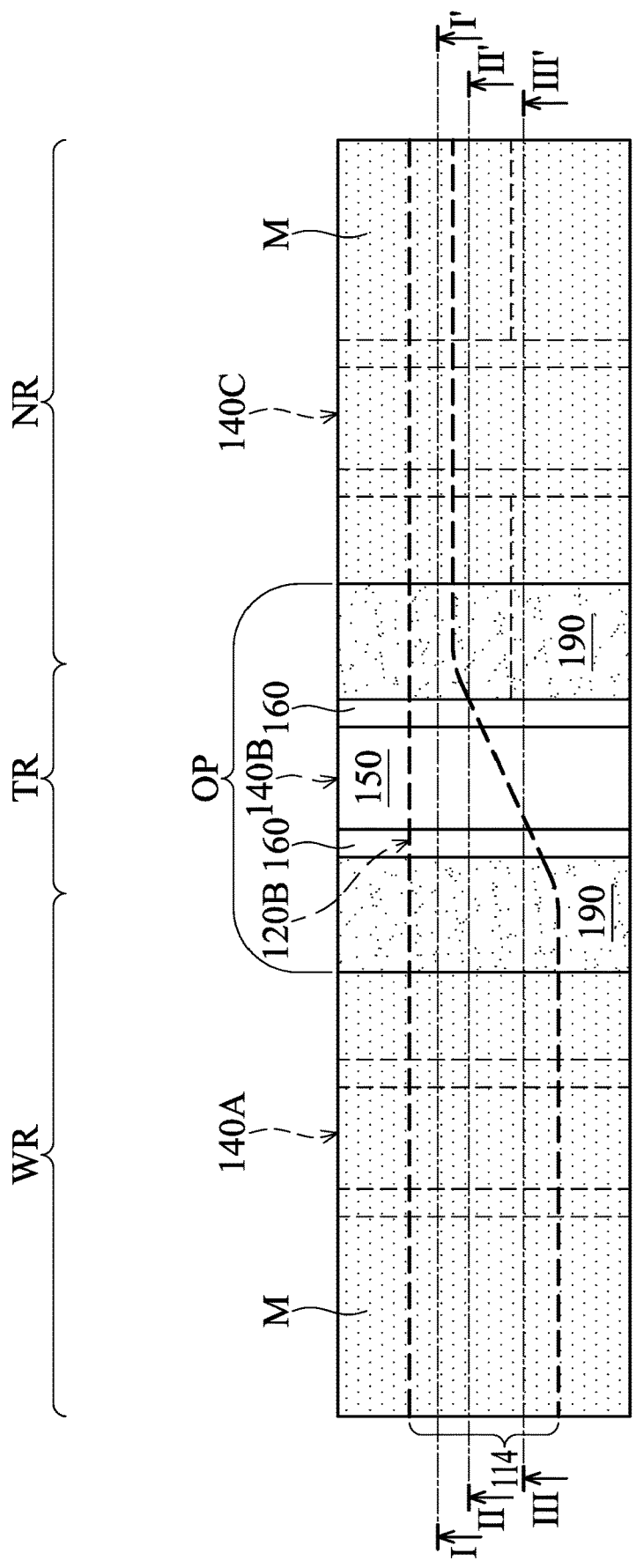
Figures 1, 2E:
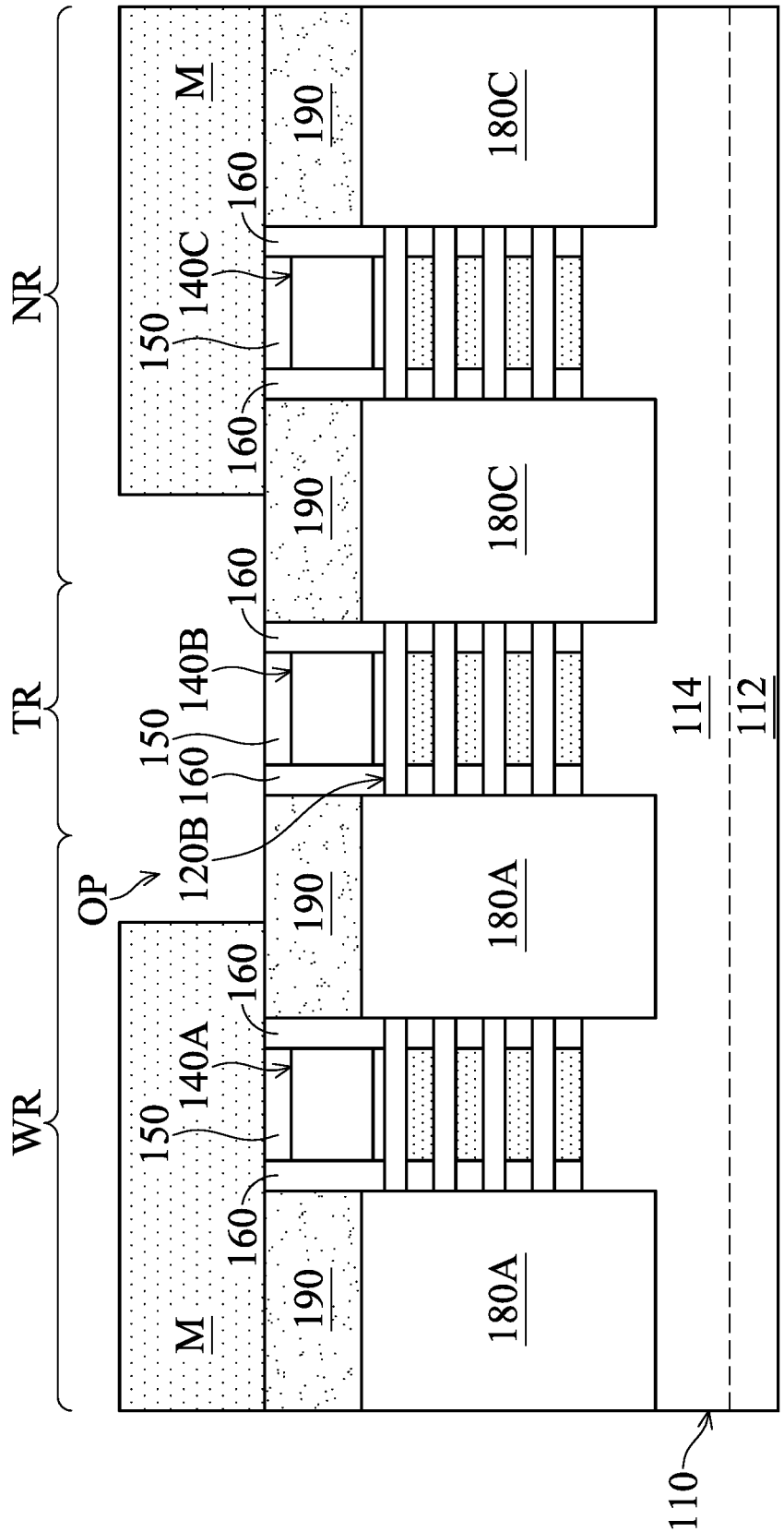
Figures 2, 2E:
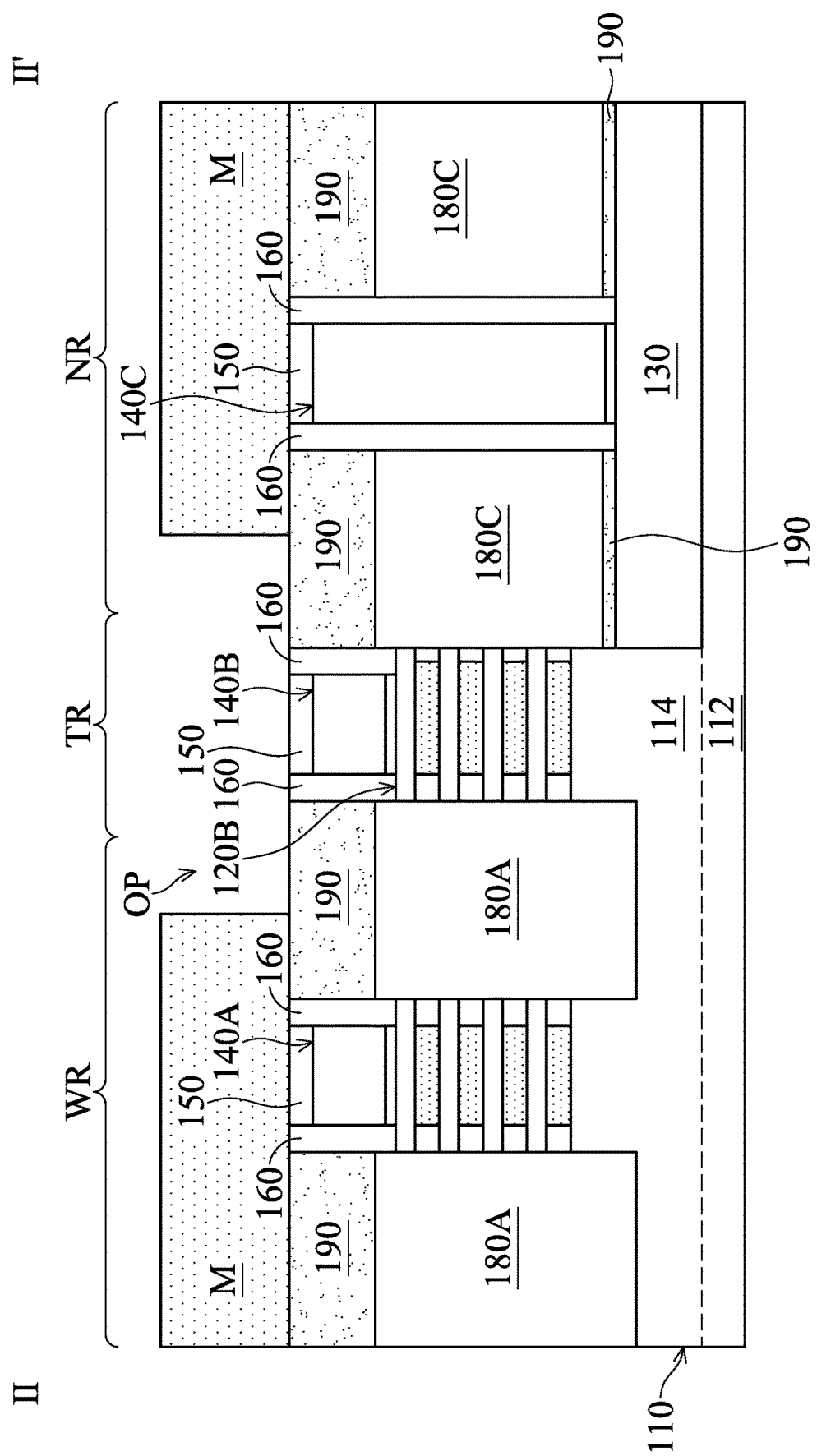
Figures 2, 2E, 3:
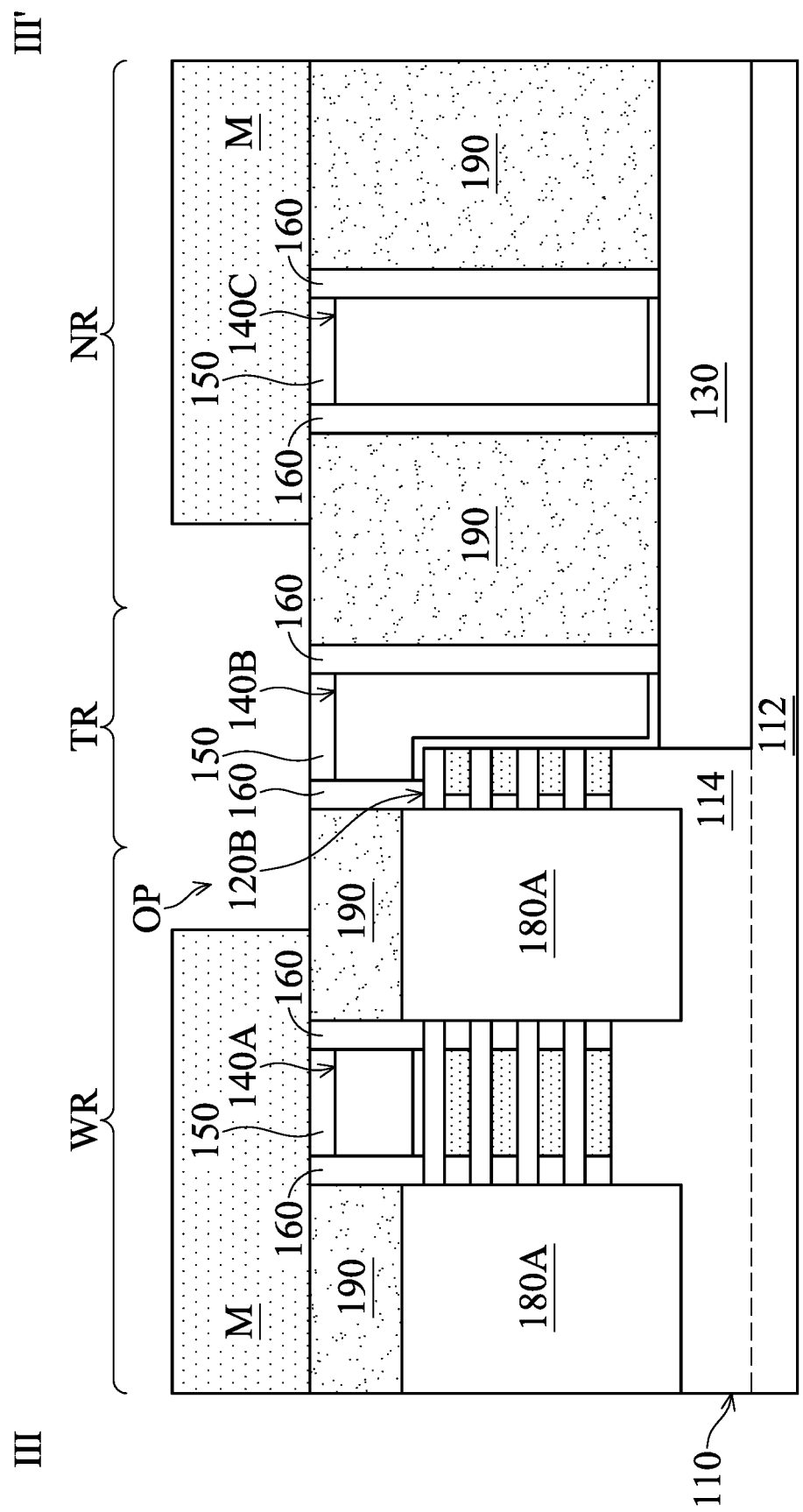
Figure 2F:
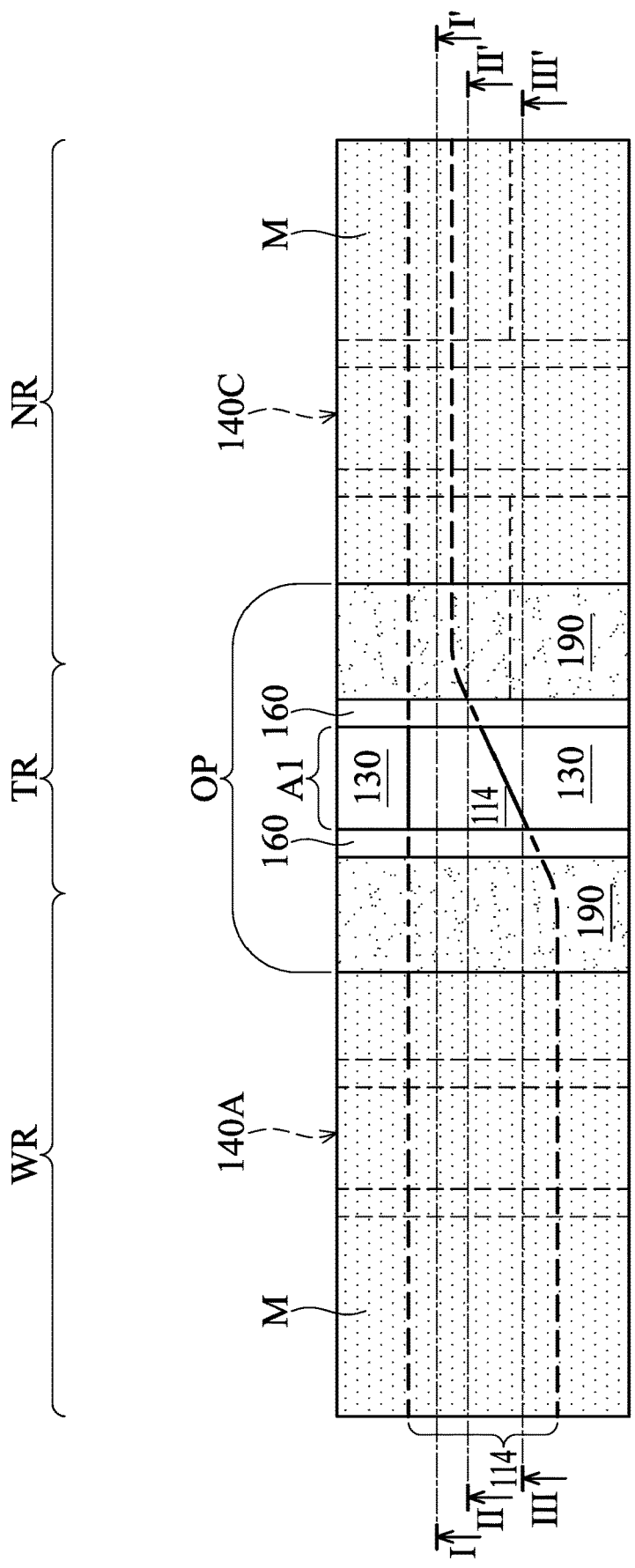
Figures 1, 2F:
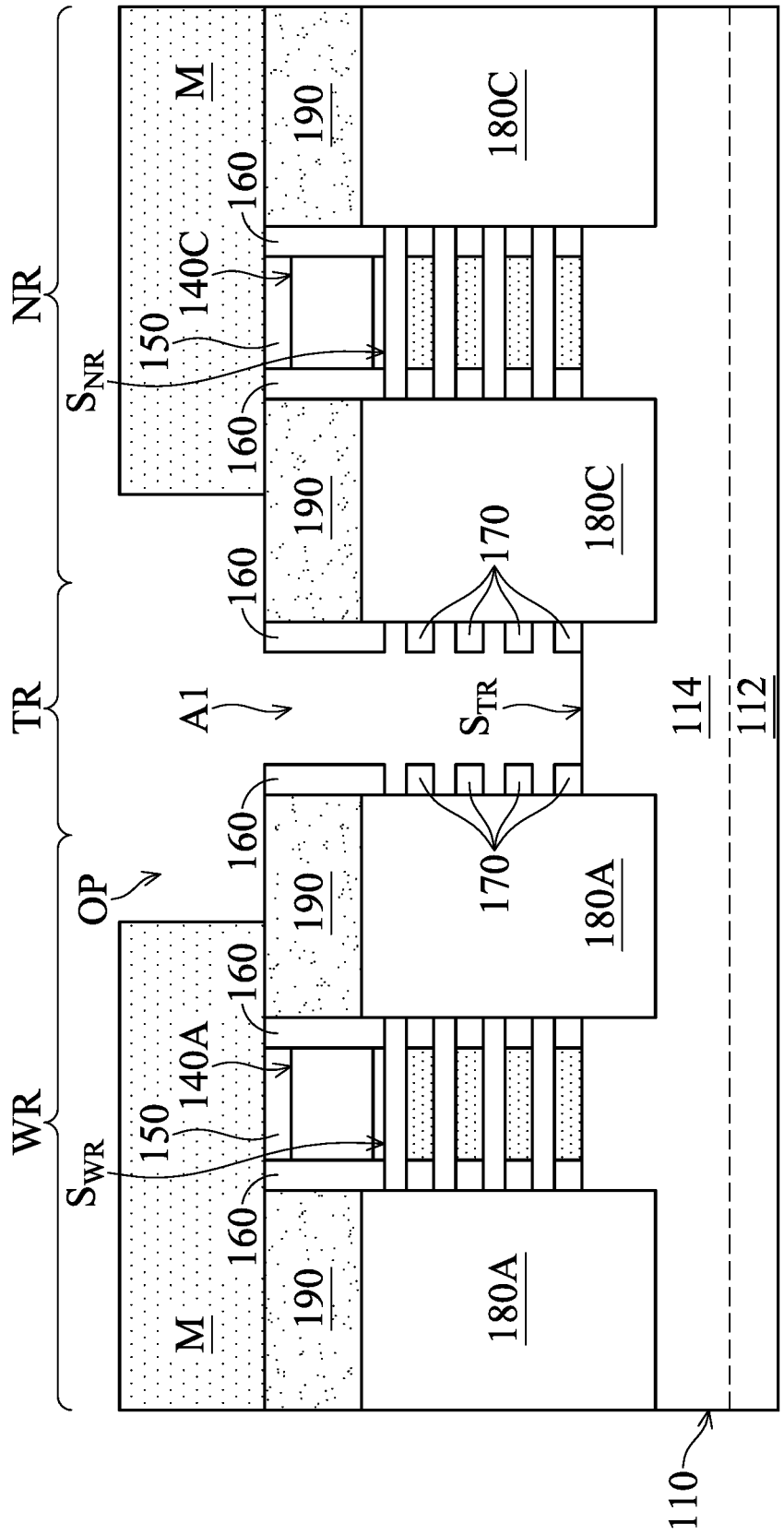
Figures 2, 2F:
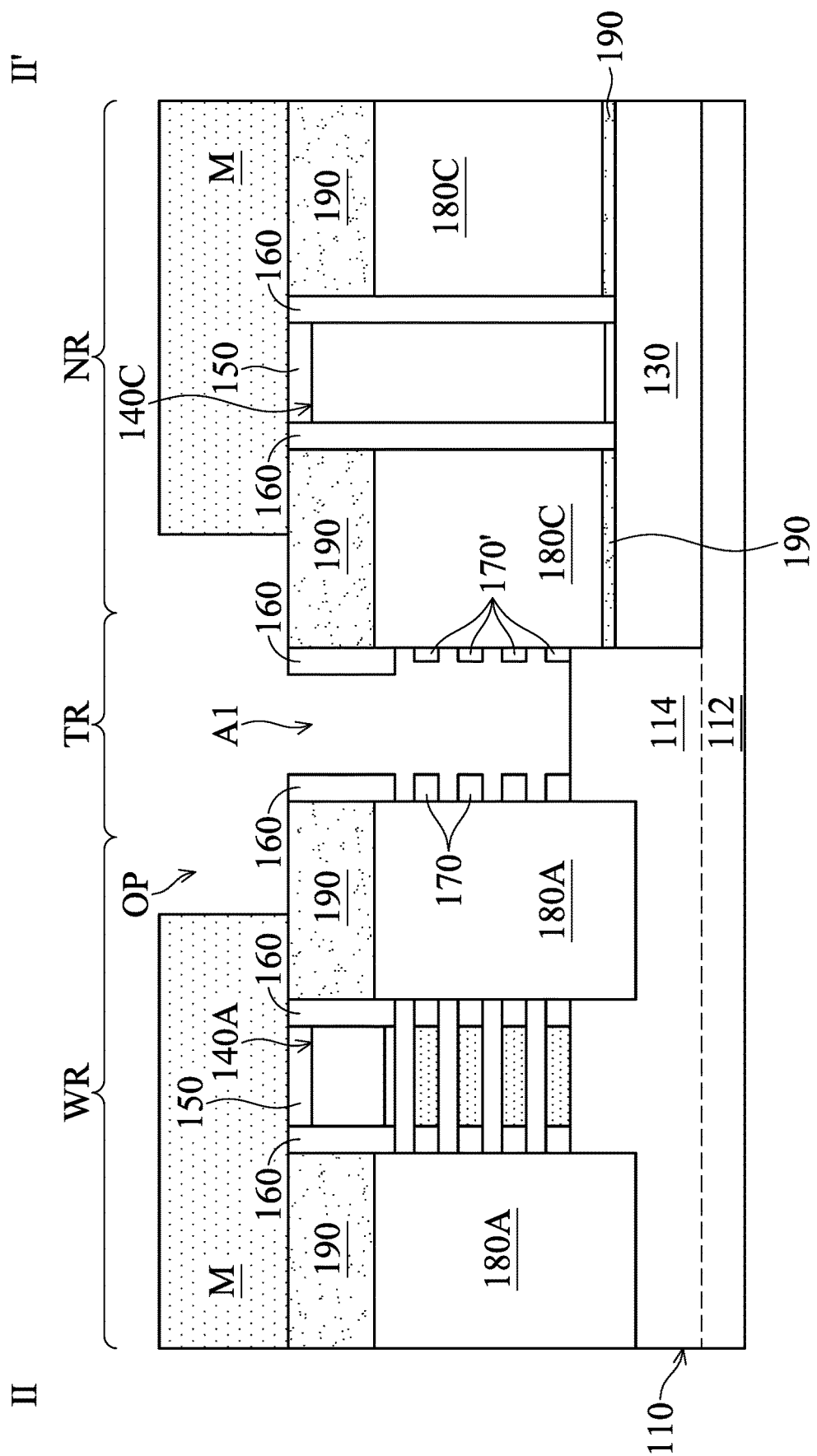
Figures 2, 2F, 3:
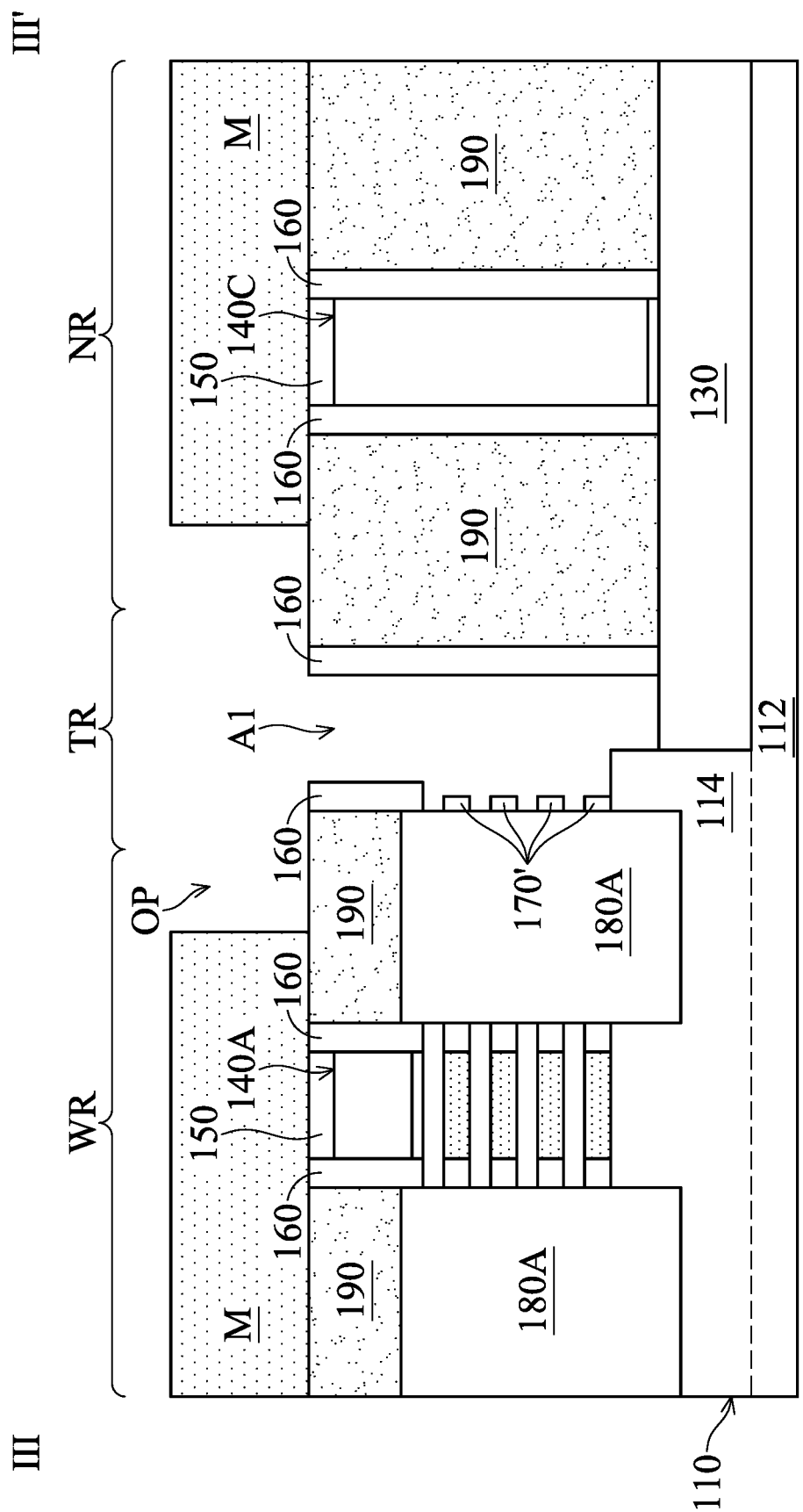
Figure 2G:
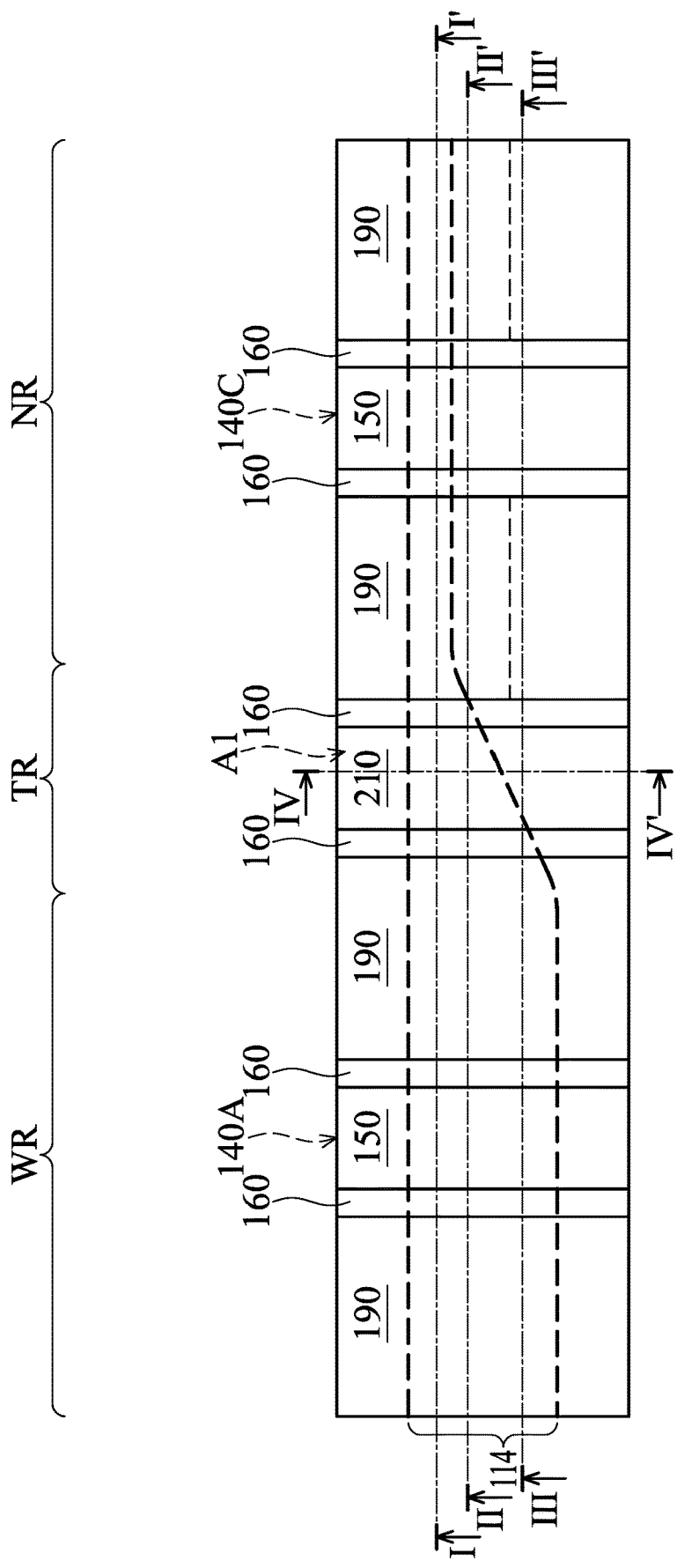
Figures 1, 2G:
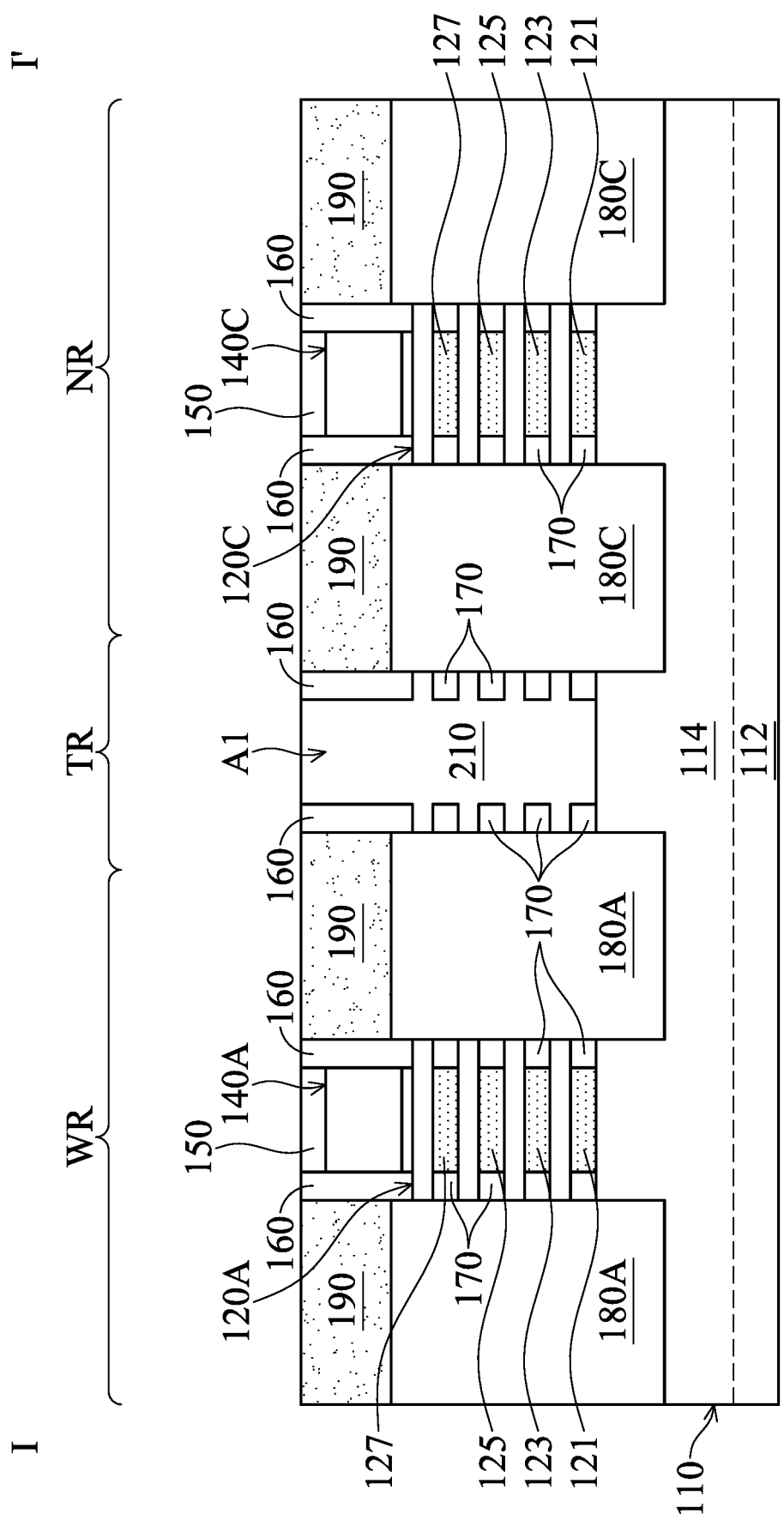
Figures 2, 2G:
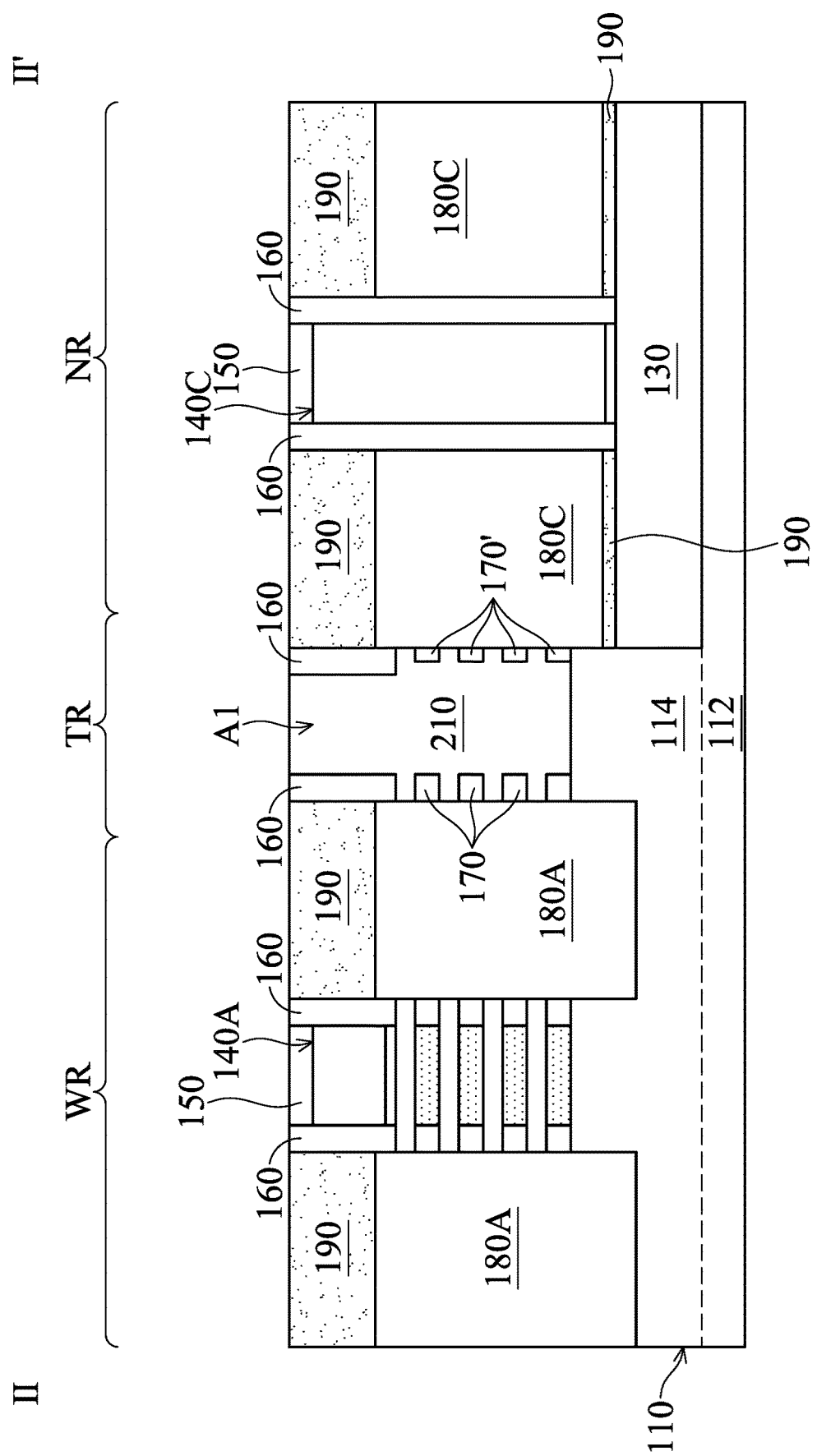
Figures 2, 2G, 3:
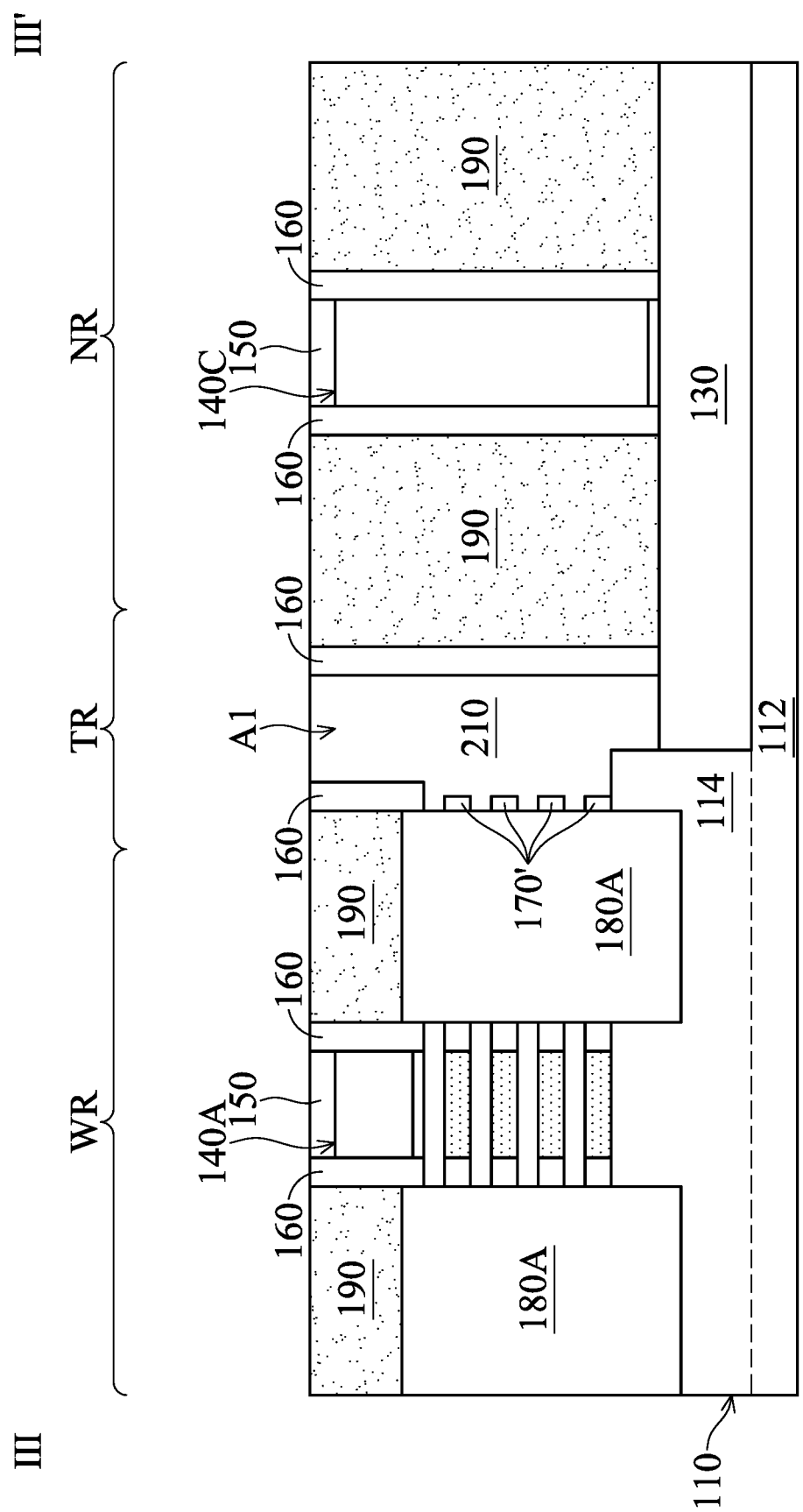
Figures 2, 2G, 3, 4:
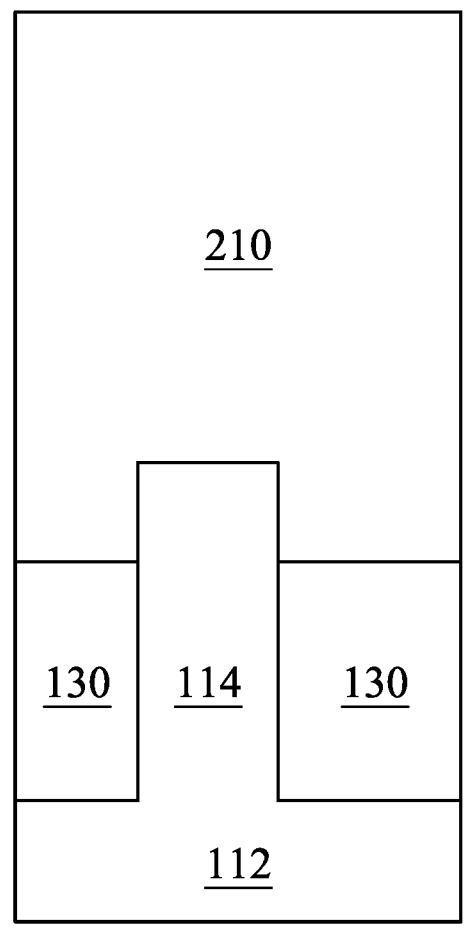
Figure 2H:
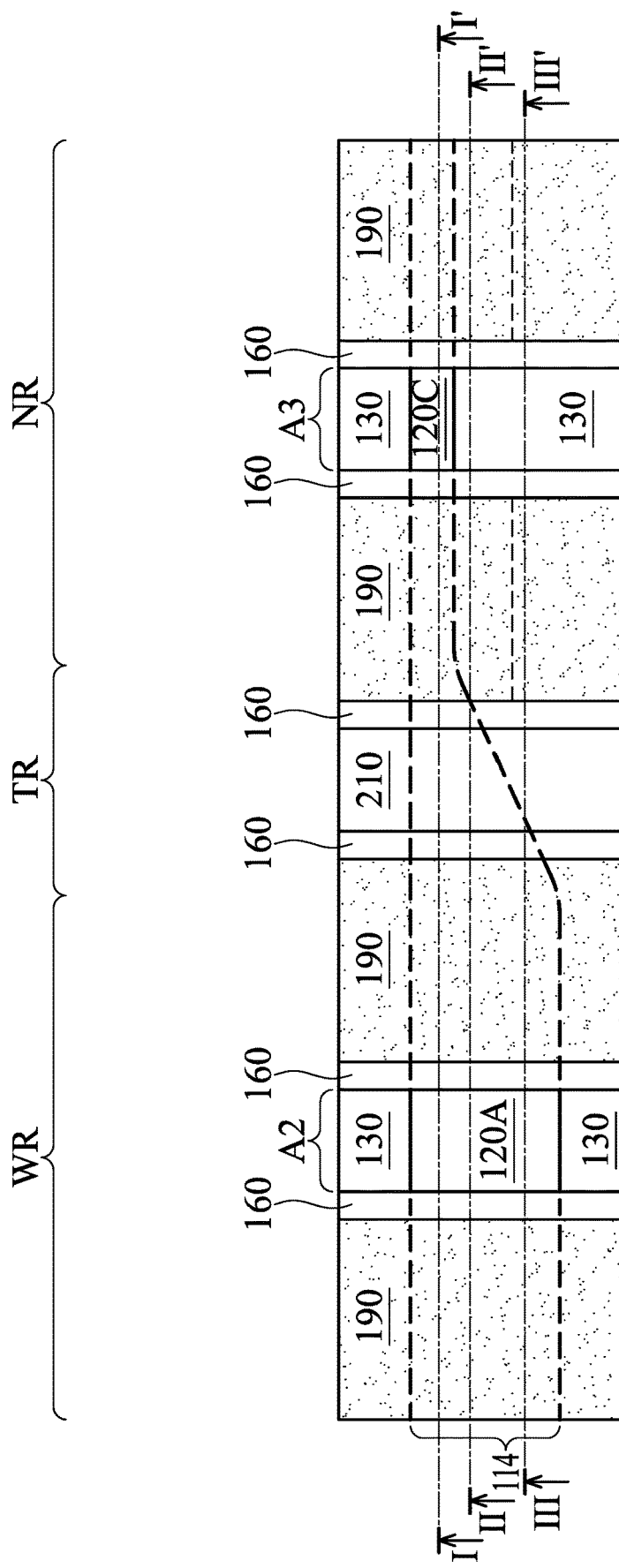
Figures 1, 2H:
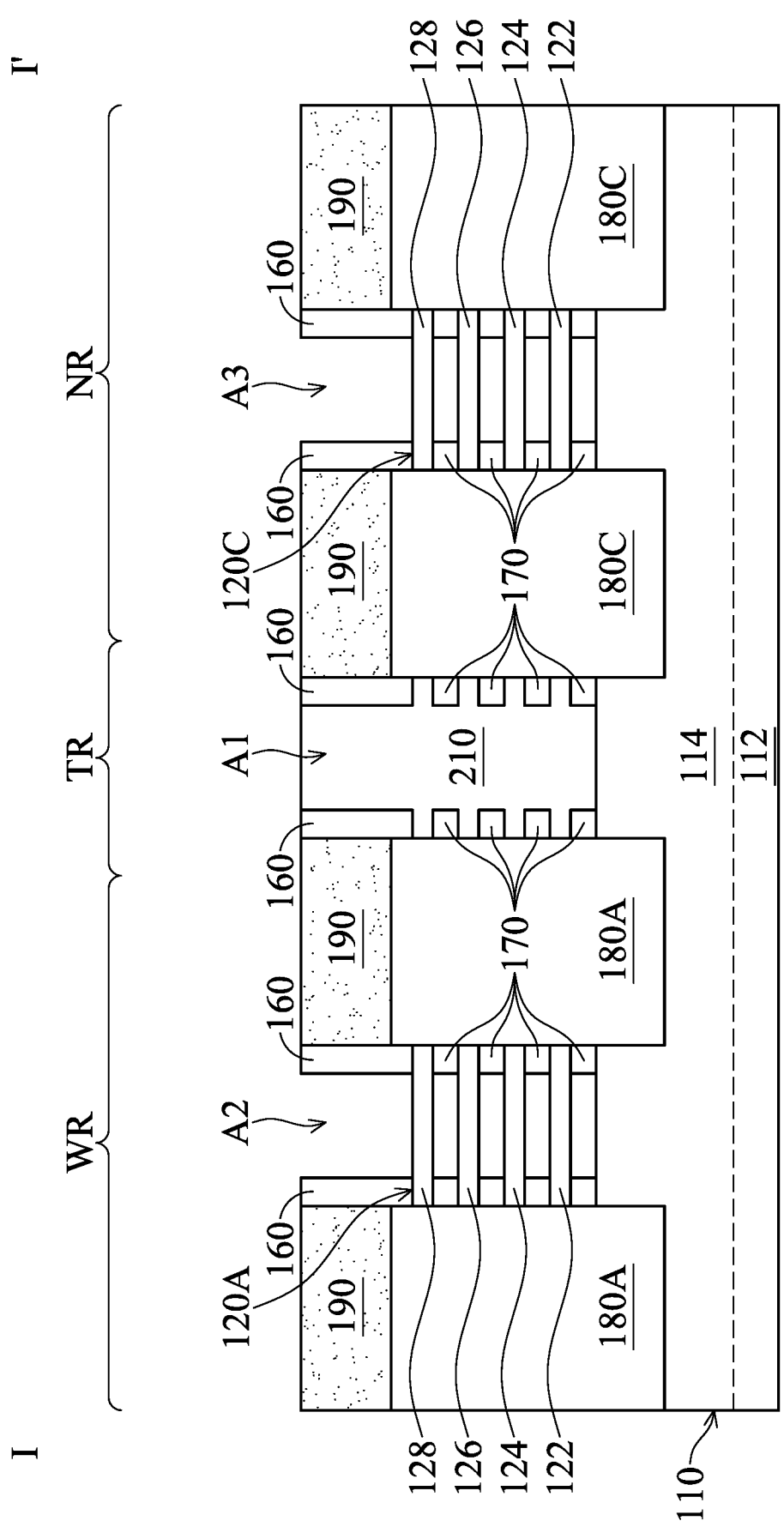
Figures 2, 2H:
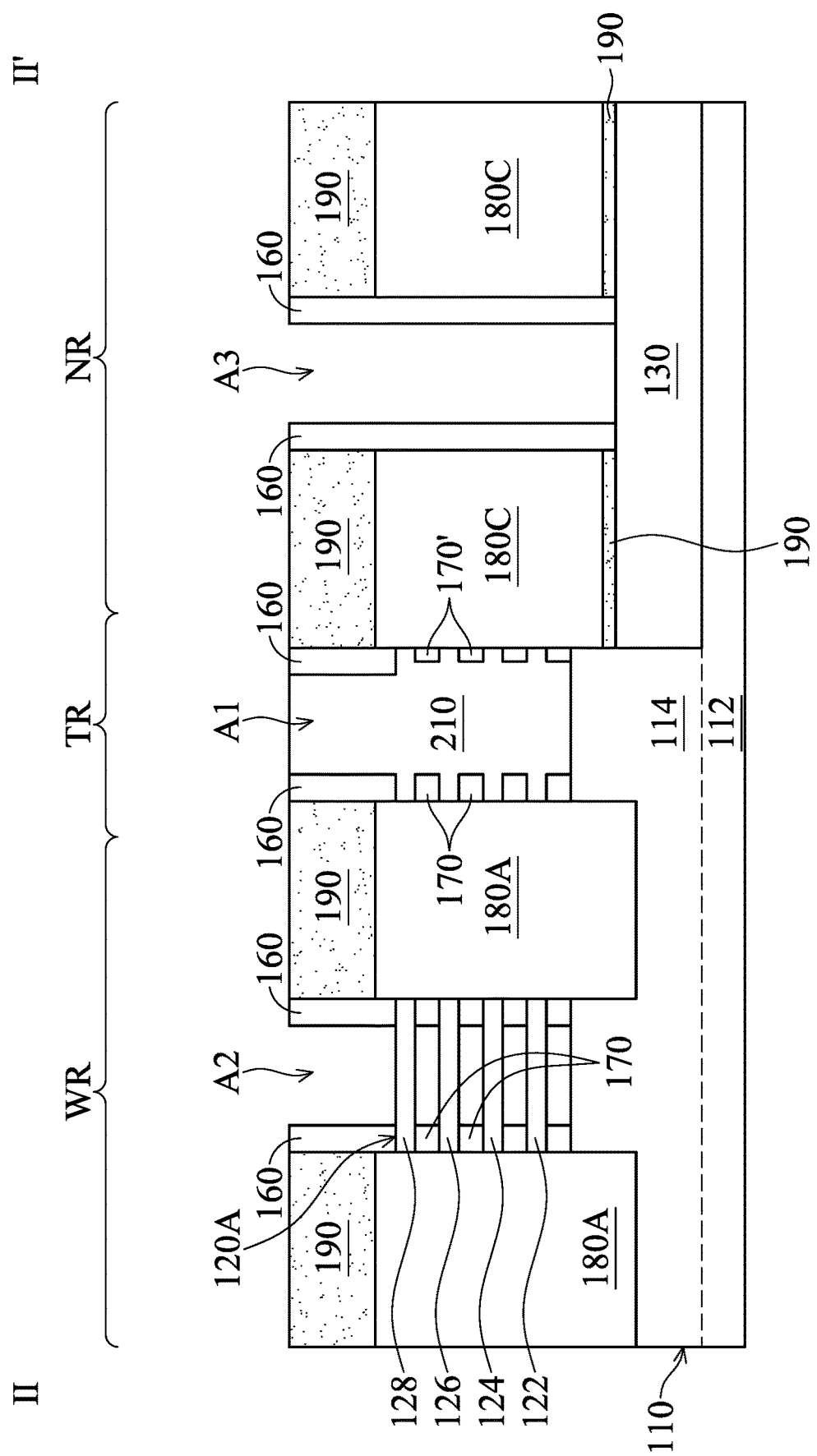
Figures 2, 2H, 3:
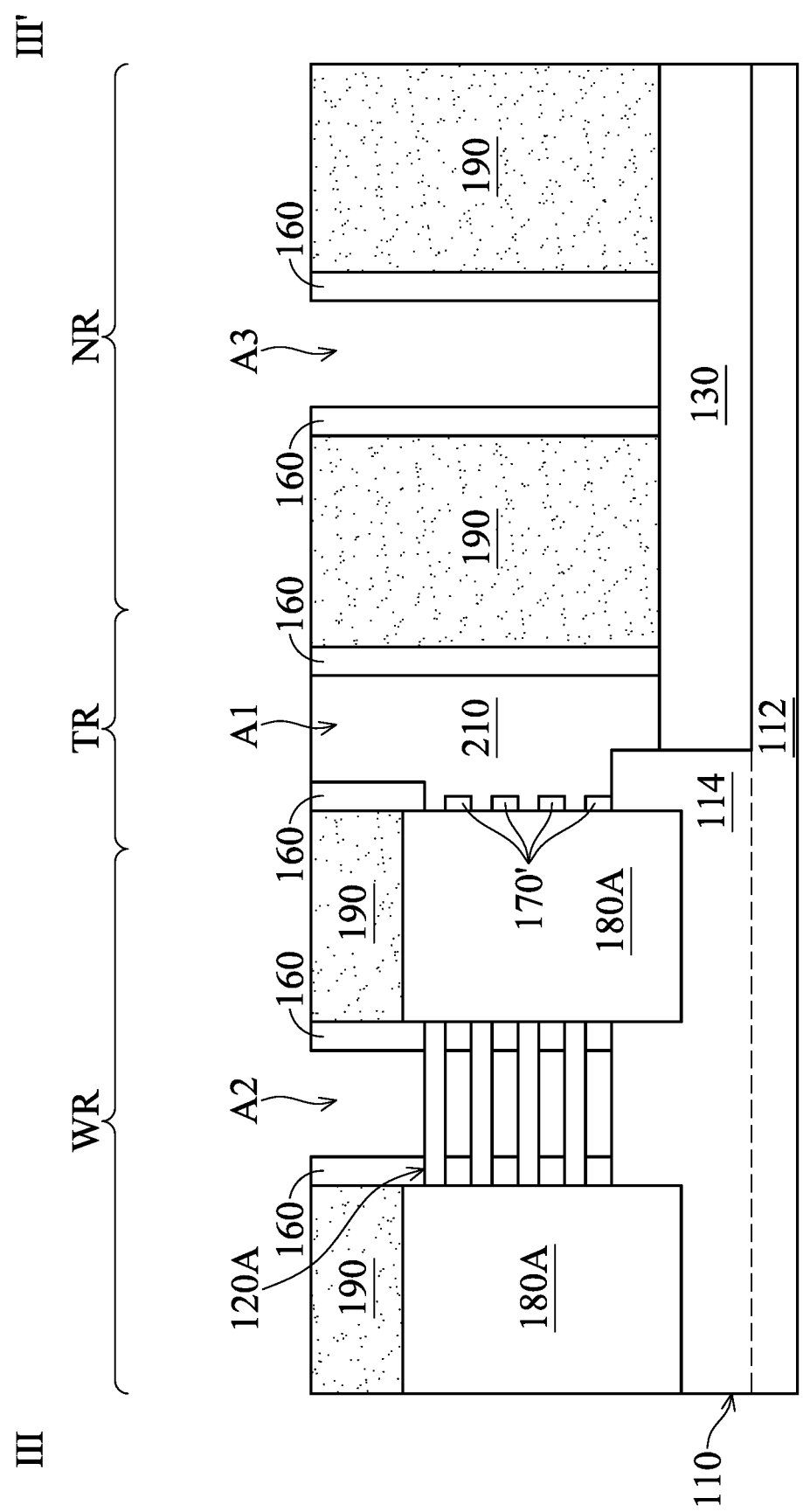
Figure 2I:
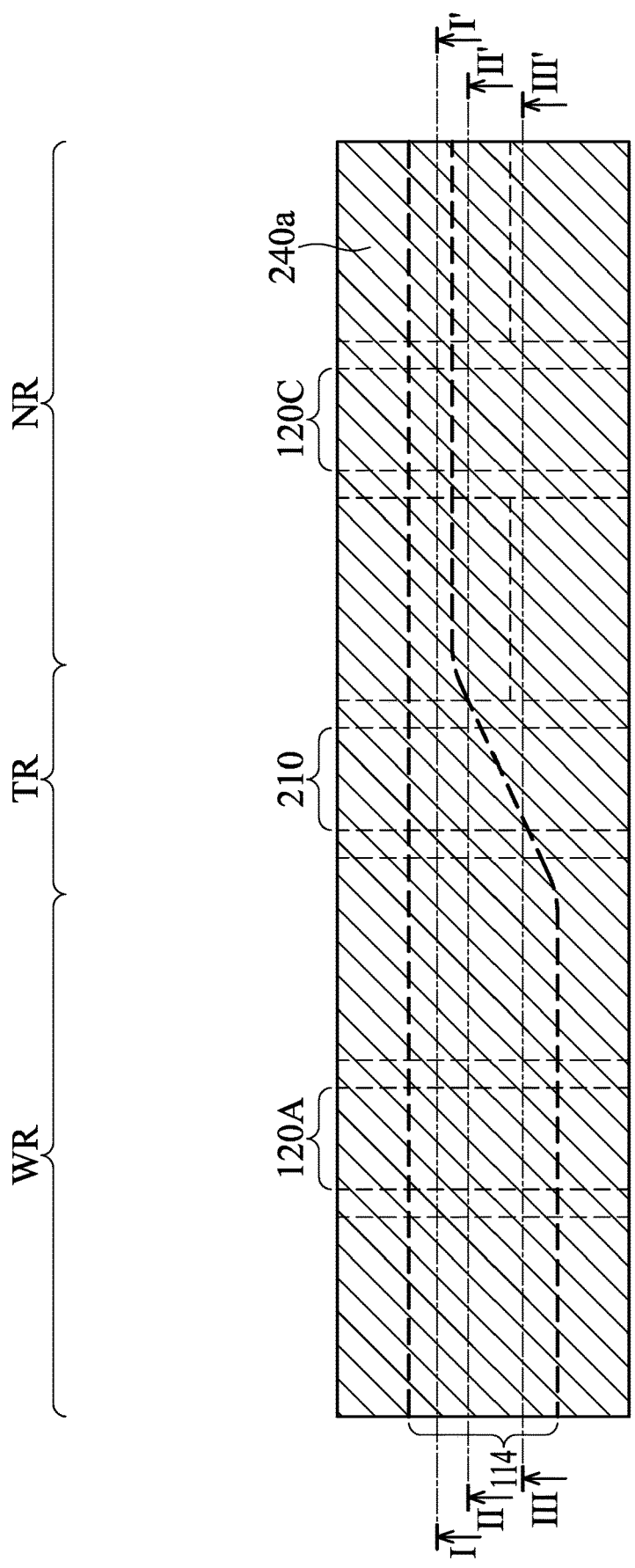
Figures 1, 2I:
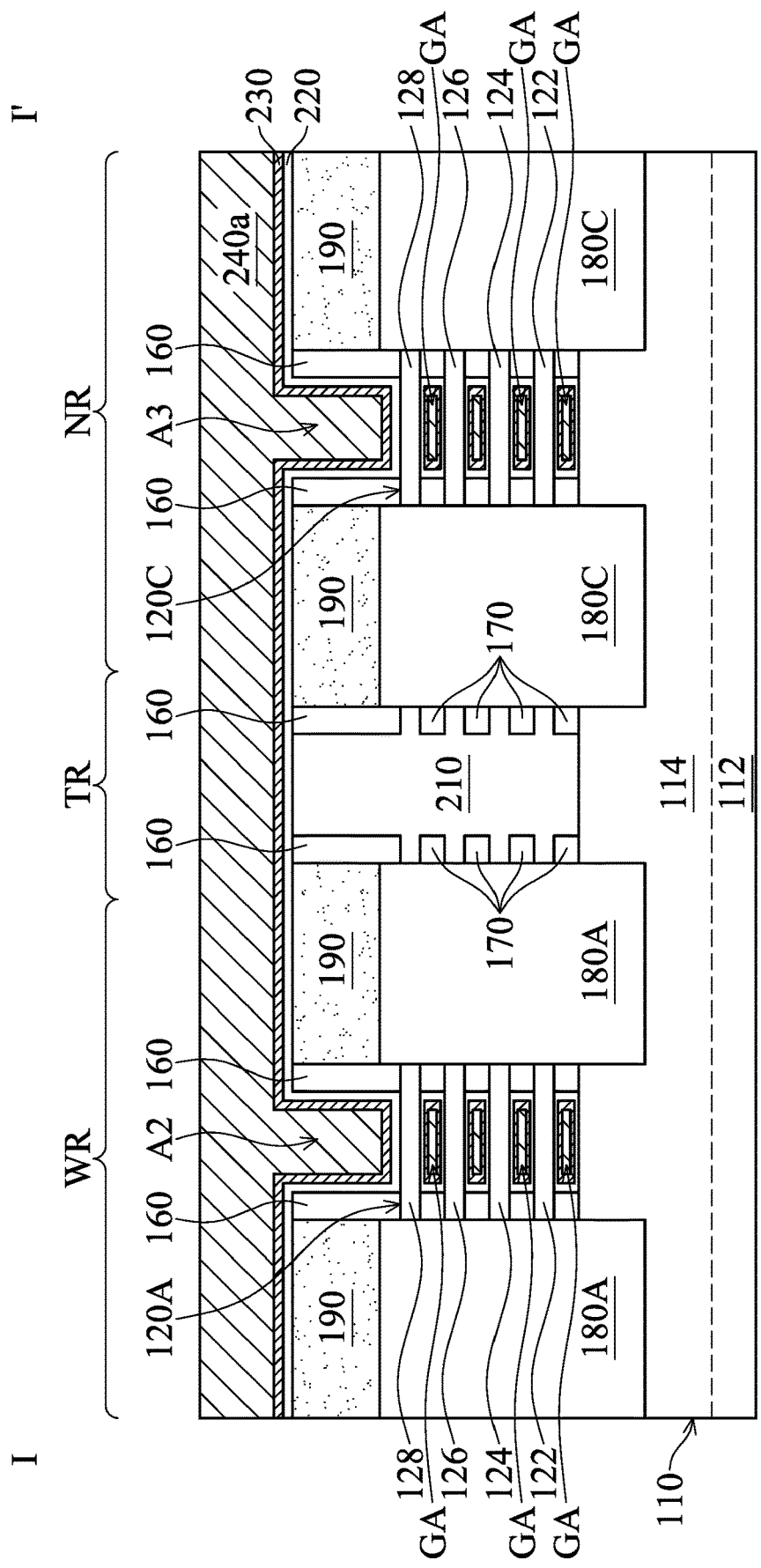
Figures 2, 2I:
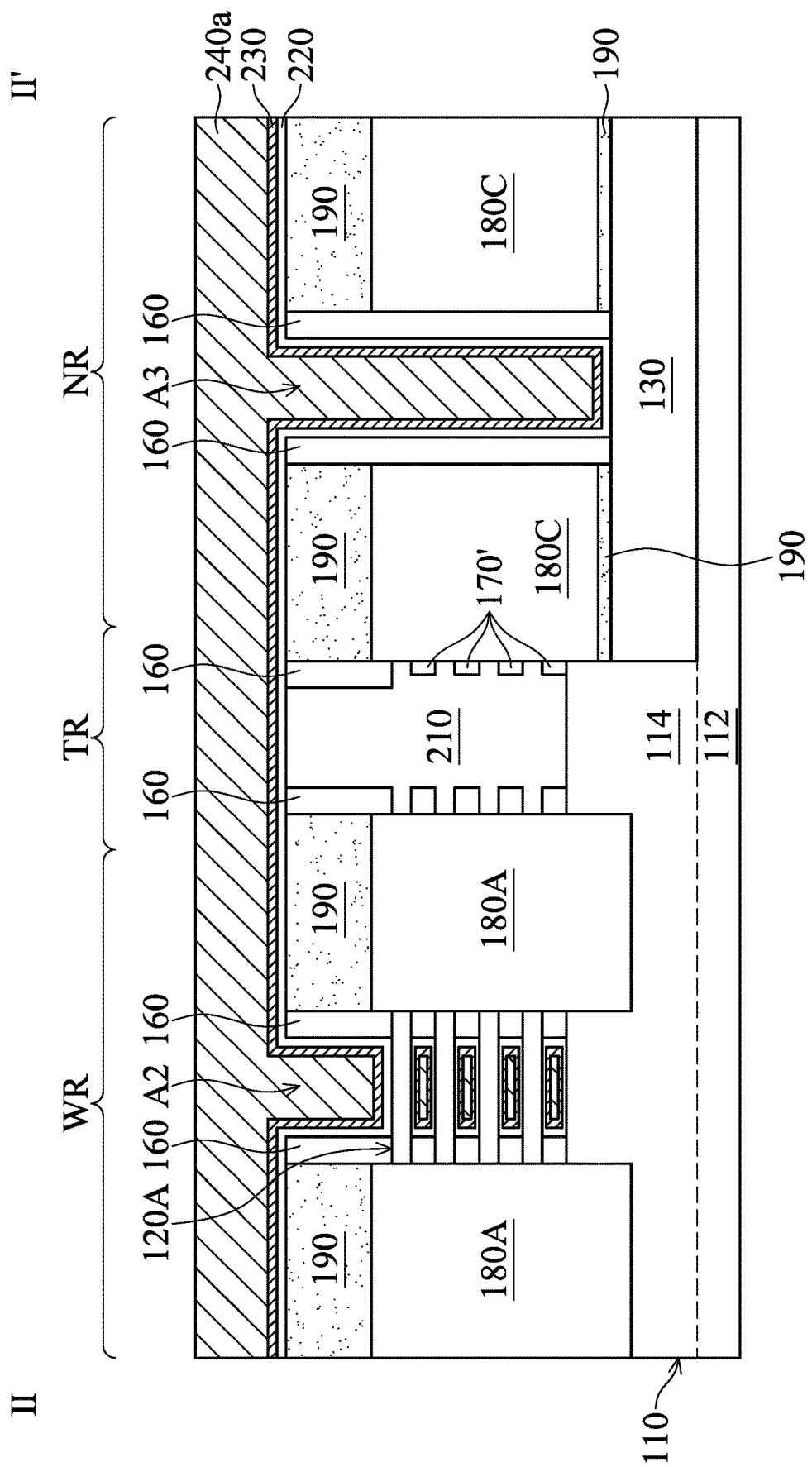
Figures 2, 2I, 3:
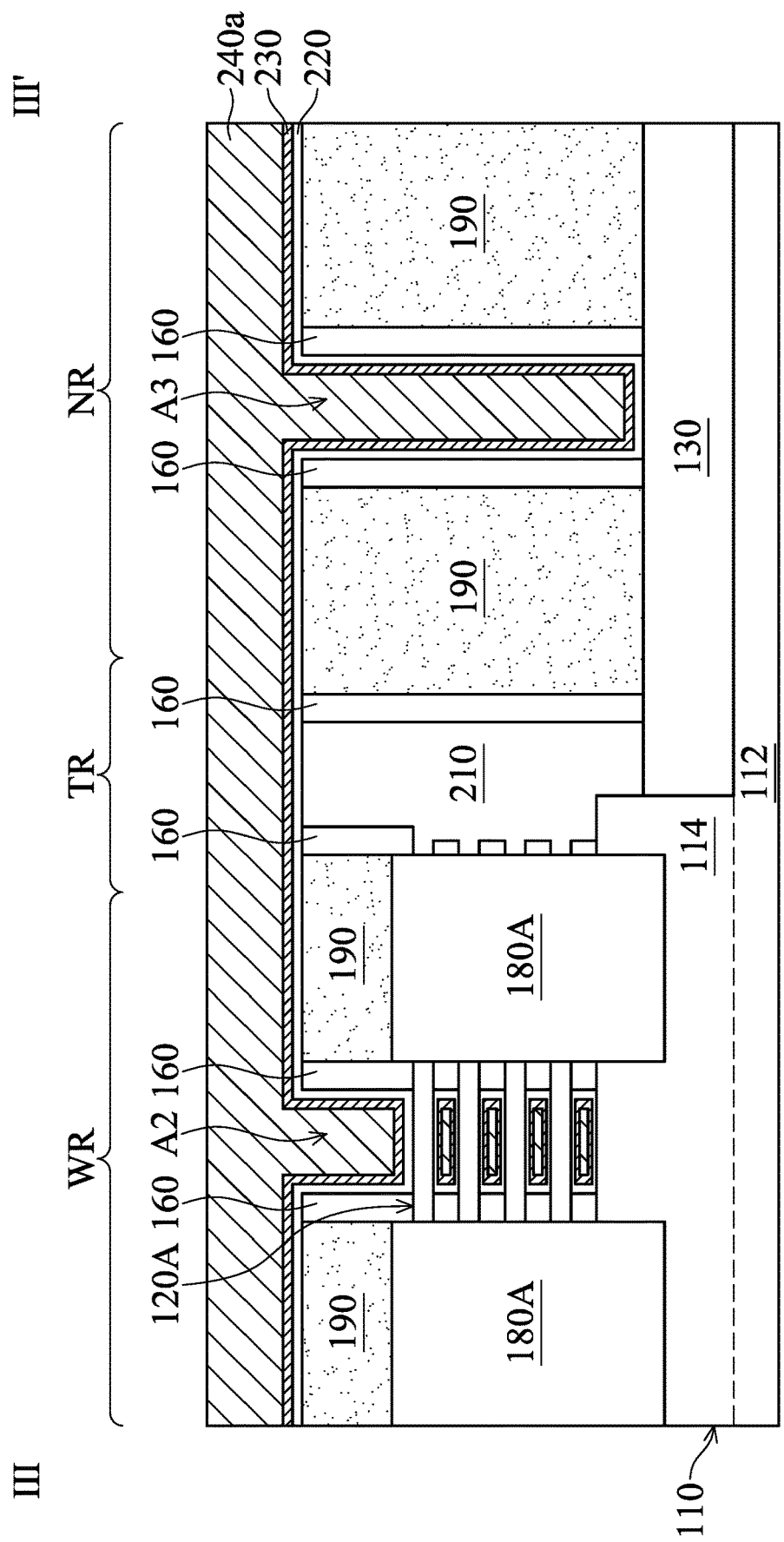
Figure 2J:
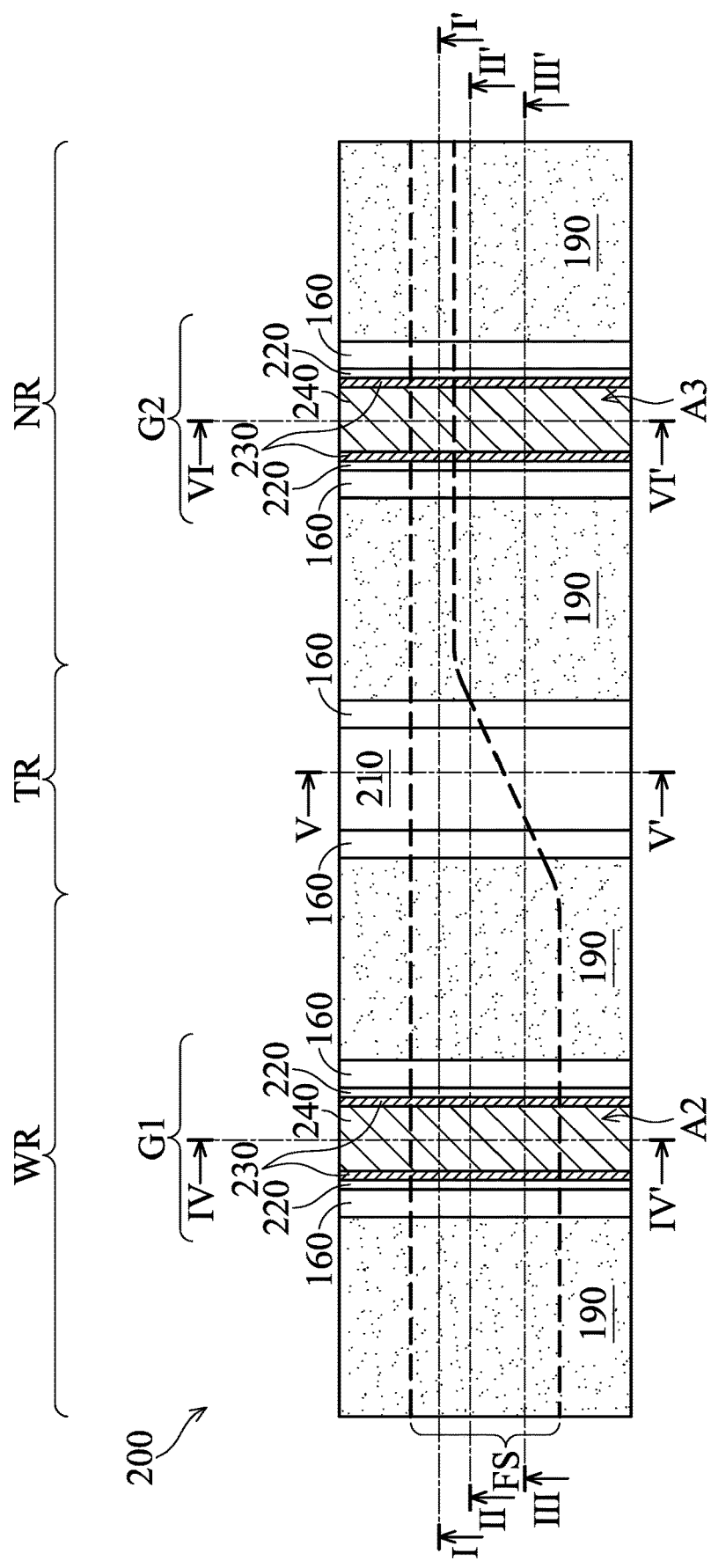
Figures 1, 2J:
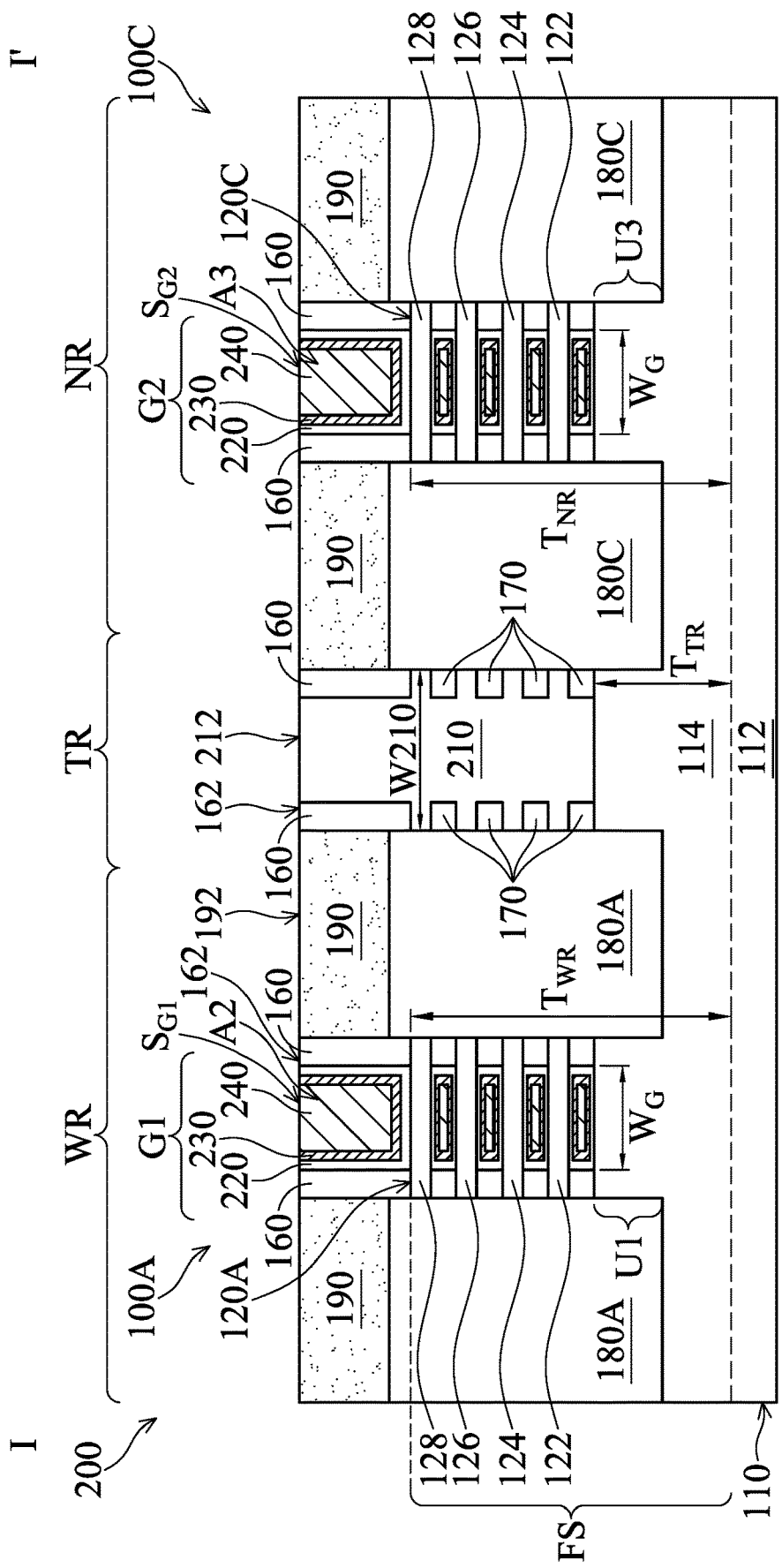
Figures 2, 2J:
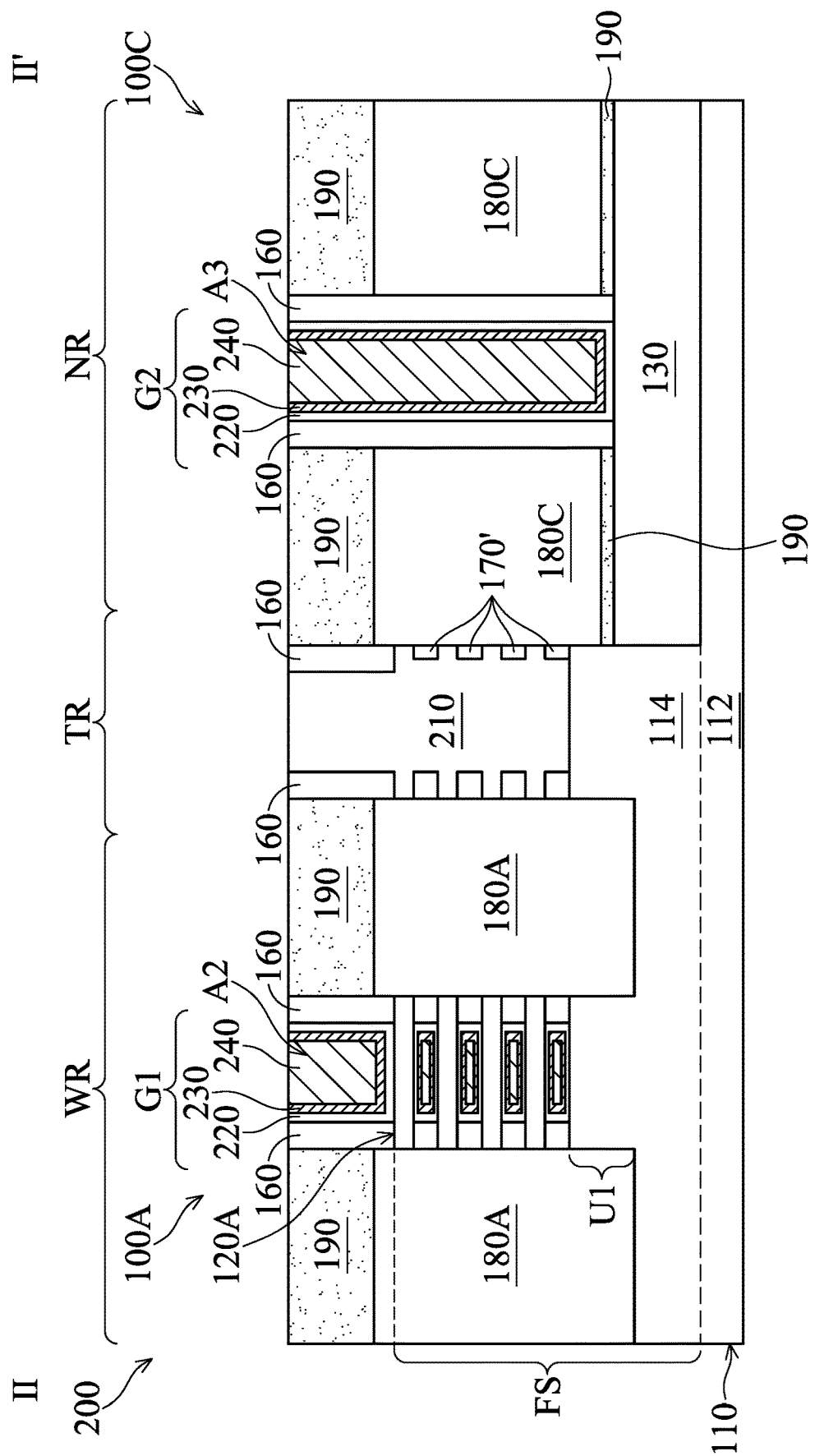
Figures 2, 2J, 3:
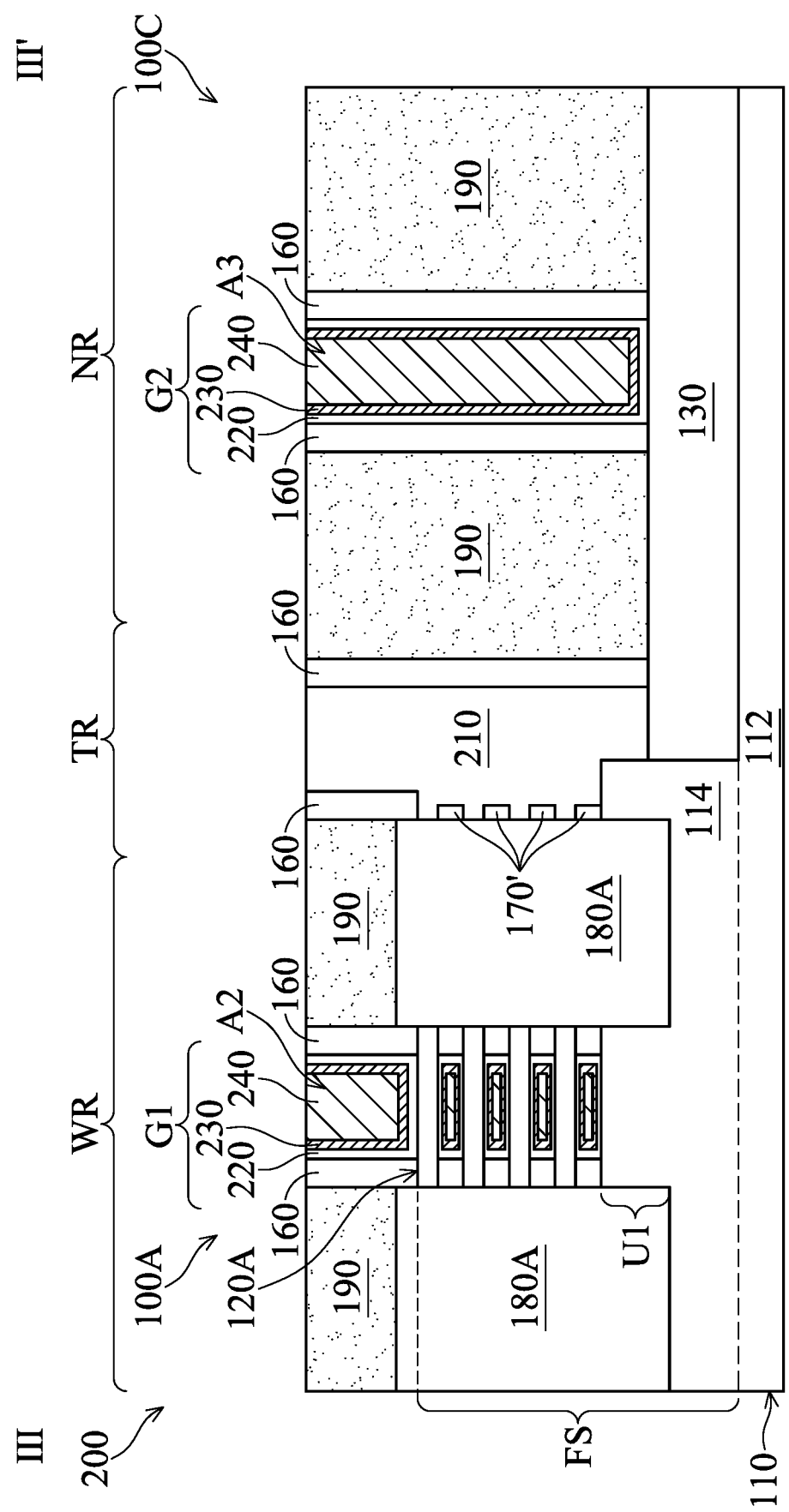
Figures 2, 2J, 3, 4, 5, 6:
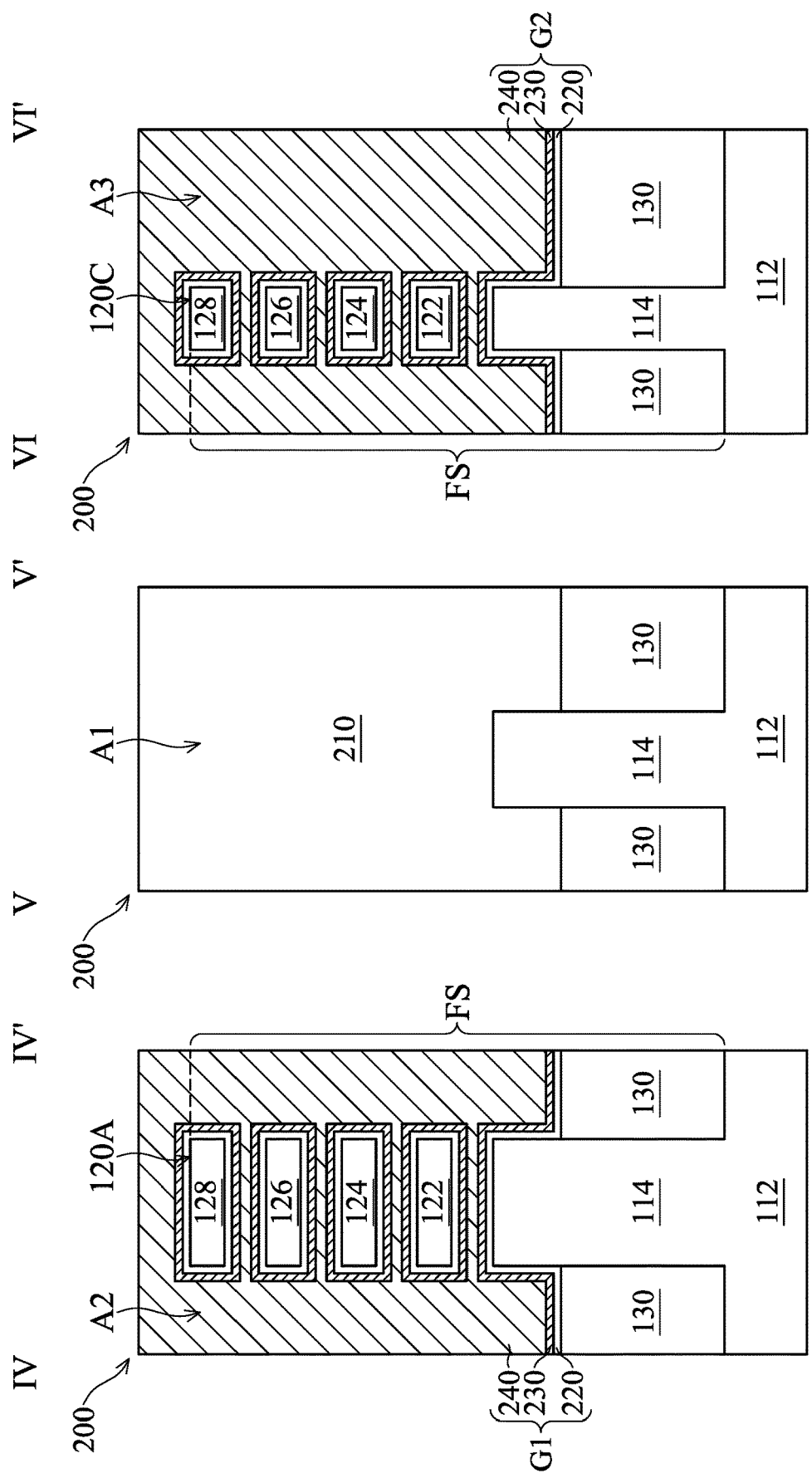
Figures 2, 2J, 3, 4, 5, 6, 7:
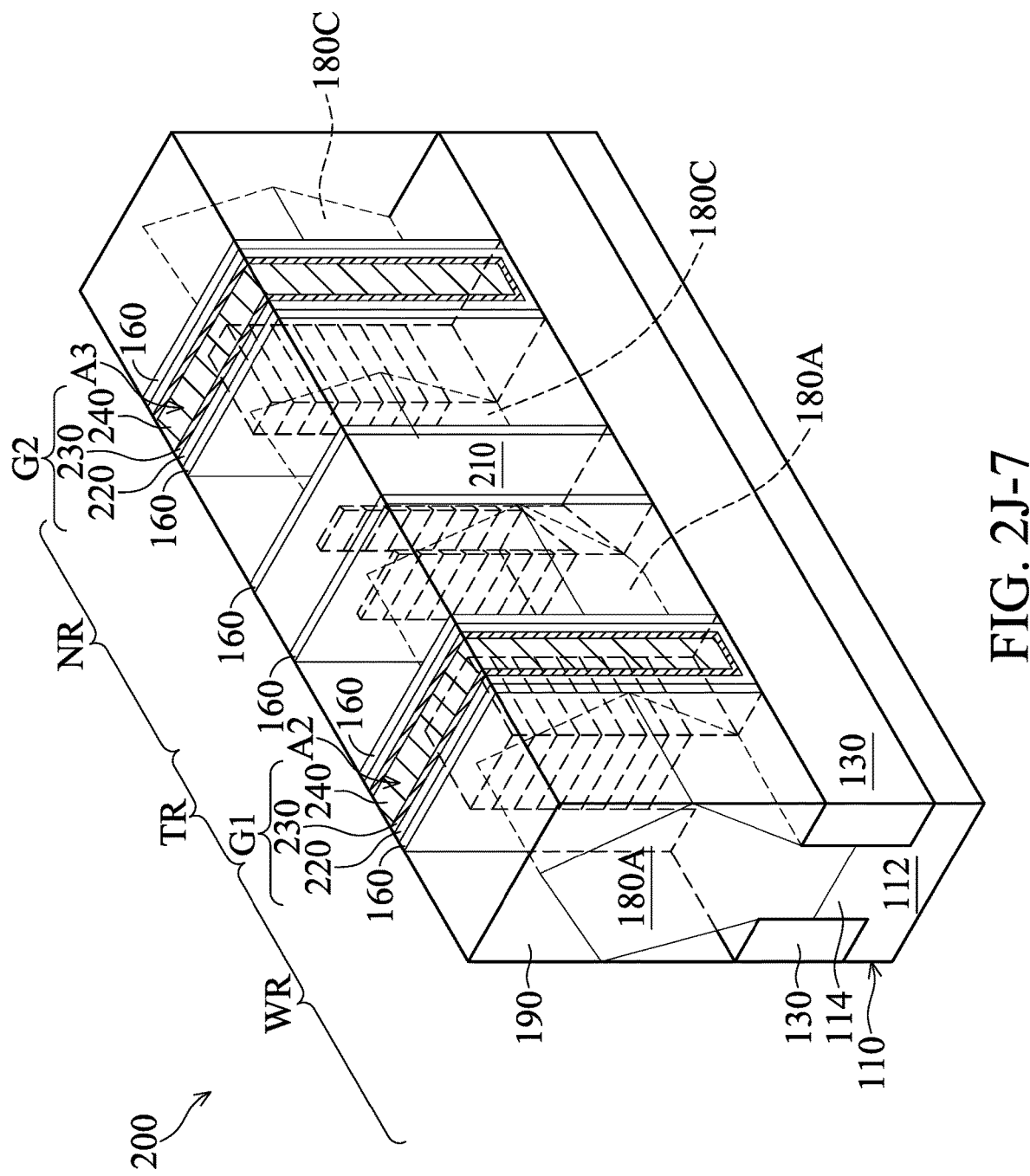

FIGS. 2A-2 to 2J-2 are cross-sectional views illustrating the semiconductor device structure along a sectional line II-II' in FIGS. 2A-2J, in accordance with some embodiments. FIGS. 2A-3 to 2J-3 are cross-sectional views illustrating the semiconductor device structure along a sectional line in FIGS. 2A-2J, in accordance with some embodiments.

As shown in FIGS. 1B, 2A, 2A-1, 2A-2, and 2A-3, gate stacks 140A, 140B, and 140C and a mask layer 150 are formed over the fin FS and the isolation layer 130, in accordance with some embodiments. The gate stacks 140A, 140B, and 140C are formed over the nanostructure stack 120, the bottom part 114, and the isolation layer 130, in accordance with some embodiments.

The gate stack 140A is wrapped around the wide portion WR of the fin FS, in accordance with some embodiments. The gate stack 140B is wrapped around the width-transition portion TR of the fin FS, in accordance with some embodiments. The gate stack 140C is wrapped around the narrow portion NR of the fin FS, in accordance with some embodiments.

The gate stack 140A includes a gate dielectric layer 142a and a gate electrode 144a, in accordance with some embodiments. The gate electrode 144a is over the gate dielectric layer 142a, in accordance with some embodiments. The gate dielectric layer 142a is positioned between the gate electrode 144a and the nanostructure stack 120, in accordance with some embodiments.

The gate dielectric layer 142a is also positioned between the gate electrode 144a and the bottom part 114, in accordance with some embodiments. The gate dielectric layer 142a is positioned between the gate electrode 144a and the isolation layer 130, in accordance with some embodiments.

The gate dielectric layer 142a is made of an oxide-containing material such as silicon oxide, in accordance with some embodiments. The gate dielectric layer 142a is formed using a chemical vapor deposition process and an etching process, in accordance with some embodiments.

The gate electrode 144a is made of a semiconductor material such as polysilicon, in accordance with some embodiments. The gate electrode 144a is formed using a chemical vapor deposition process and an etching process, in accordance with some embodiments.

The gate stack 140B includes a gate dielectric layer 142b and a gate electrode 144b, in accordance with some embodiments. The gate electrode 144b is over the gate dielectric layer 142b, in accordance with some embodiments. The gate dielectric layer 142b is positioned between the gate electrode 144b and the nanostructure stack 120, in accordance with some embodiments.

The gate dielectric layer 142b is also positioned between the gate electrode 144b and the bottom part 114, in accordance with some embodiments. The gate dielectric layer 142b is positioned between the gate electrode 144b and the isolation layer 130, in accordance with some embodiments.

The gate dielectric layer 142b is made of an oxide-containing material such as silicon oxide, in accordance with some embodiments. The gate dielectric layer 142b is formed using a chemical vapor deposition process and an etching process, in accordance with some embodiments.

The gate electrode 144b is made of a semiconductor material such as polysilicon, in accordance with some embodiments. The gate electrode 144b is formed using a chemical vapor deposition process and an etching process, in accordance with some embodiments.

The gate stack 140C includes a gate dielectric layer 142c and a gate electrode 144c, in accordance with some embodiments. The gate electrode 144c is over the gate dielectric layer 142c, in accordance with some embodiments. The gate dielectric layer 142c is positioned between the gate electrode 144c and the nanostructure stack 120, in accordance with some embodiments.

The gate dielectric layer 142c is also positioned between the gate electrode 144c and the bottom part 114, in accordance with some embodiments. The gate dielectric layer 142c is positioned between the gate electrode 144c and the isolation layer 130, in accordance with some embodiments.

The gate dielectric layer 142c is made of an oxide-containing material such as silicon oxide, in accordance with some embodiments. The gate dielectric layer 142c is formed using a chemical vapor deposition process and an etching process, in accordance with some embodiments.

The gate electrode 144c is made of a semiconductor material such as polysilicon, in accordance with some embodiments. The gate electrode 144c is formed using a chemical vapor deposition process and an etching process, in accordance with some embodiments.

The mask layer 150 is positioned over the gate stacks 140A, 140B, and 140C, in accordance with some embodiments. The mask layer 150 is made of a different material than the gate stacks 140A, 140B, and 140C, in accordance with some embodiments. The mask layer 150 is made of nitrides (e.g., silicon nitride) or oxynitride (e.g., silicon oxynitride), in accordance with some embodiments.

As shown in FIG. 1A, a gate spacer 160 is formed over sidewalls 140A1, 140B1, 140C1, and 152 of the gate stacks 140A, 140B, and 140C and the mask layer 150, in accordance with some embodiments.

The gate spacer 160 surrounds the gate stacks 140A, 140B, and 140C and the mask layer 150, in accordance with some embodiments. The gate spacer 160 is positioned over the fin FS and the isolation layer 130, in accordance with some embodiments.

The gate spacer 160 includes insulating materials, such as silicon oxide, silicon nitride, silicon oxynitride, or silicon carbide, in accordance with some embodiments. The gate spacer 160 is made of a material different from that of the gate stacks 140A, 140B, and 140C and the mask layer 150, in accordance with some embodiments. The formation of the gate spacer 160 includes a deposition process and an anisotropic etching process, in accordance with some embodiments.

As shown in FIGS. 2B, 2B-1, 2B-2, and 2B-3, portions of the fin FS, which are not covered by the gate stacks 140A, 140B, and 140C and the gate spacer 160, are removed, in accordance with some embodiments. The removal process forms trenches R in the fin FS, in accordance with some embodiments.

As shown in FIGS. 2A-1, 2B, and 2B-1, the nanostructure stack 120 is divided into nanostructure stacks 120A, 120B, and 120C by the trenches R, in accordance with some embodiments. As shown in FIG. 2B-1, sidewalls of the nanostructures 121, 122, 123, 124, 125, 126, 127, and 128 of the nanostructure stack 120A are substantially aligned with (or substantially coplanar with) sidewalls of the gate spacer 160 thereover, in accordance with some embodiments.

Similarly, sidewalls of the nanostructures 121, 122, 123, 124, 125, 126, 127, and 128 of the nanostructure stack 120B are substantially aligned with (or substantially coplanar with) sidewalls of the gate spacer 160 thereover, in accordance with some embodiments. In some embodiments, sidewalls of the nanostructures 121, 122, 123, 124, 125, 126, 127, and 128 of the nanostructure stack 120C are substantially aligned with (or substantially coplanar with) sidewalls of the gate spacer 160 thereover.

As shown in FIG. 2B-1, upper portions U1, U2, and U3 of the bottom part 114 are remained under the gate stacks 140A, 140B, and 140C and the gate spacer 160 after the removal process, in accordance with some embodiments.

The upper portions U1, U2, and U3 are also referred to as channel portions, in accordance with some embodiments.

The removal process includes an etching process, in accordance with some embodiments. The etching process includes an anisotropic etching process such as a dry etching process, in accordance with some embodiments.

As shown in FIGS. 2C, 2C-1, 2C-2, and 2C-3, portions of the nanostructures 121, 123, 125, and 127 are removed through the trenches R, in accordance with some embodiments. The removal process forms recesses R1, R2, R2', and R3, in accordance with some embodiments.

The recesses R1 are in the nanostructure stack 120A, in accordance with some embodiments. The recesses R2 and the shallow recesses R2' are in the nanostructure stack 120B, in accordance with some embodiments. The recesses R3 are in the nanostructure stack 120C, in accordance with some embodiments.

As shown in FIG. 2C-1, the depths $D_{R1}$, $D_{R2}$, and $D_{R3}$ of the recesses R1, R2, and R3 are substantially equal to each other, in accordance with some embodiments. As shown in FIG. 2C, the sloped surface SFs of the width-transition portion TR intersects with a sidewall 161 of the gate spacer 160 at a point C1, in accordance with some embodiments.

As shown in FIGS. 2C and 2C-2, the shallow recesses R2' are close to the intersection point C1, in accordance with some embodiments. As shown in FIG. 2C, since the width of the width-transition portion TR increases toward the wide portion WR, the width of the right sidewall SR of the nanostructure stack 120B is the minimum width of the nanostructure stack 120B, in accordance with some embodiments.

Therefore, the area of the right sidewall SR of the nanostructure stack 120B is small, which is not conducive to etch the nanostructures 121, 123, 125, and 127 from the right sidewall SR, especially from the intersection point C1, in accordance with some embodiments. Therefore, the depth $D_{R2'}$ of the shallow recesses R2' is less than the depth $D_{R2}$ of the recesses R2, in accordance with some embodiments.

As shown in FIG. 2C, the sloped surface SFs of the width-transition portion TR intersects with a sidewall 163 of the gate spacer 160 at a point C2, in accordance with some embodiments. As shown in FIGS. 2C and 2C-3, the shallow recesses R2' are close to the intersection point C2, in accordance with some embodiments.

As shown in FIGS. 2C and 2C-3, the (lateral) length L1 of a portion of the nanostructure stack 120B is less than the sum of the (lateral) lengths L140B and L160 of the gate stack 140B and the gate spacer 160 beside the gate stack 140B, in accordance with some embodiments. The length L1 decreases toward the intersection point C2, in accordance with some embodiments.

If the length L1 of the portion of the nanostructure stack 120B is decreased, the etching rate of the portion of the nanostructure stack 120B is lowered, in accordance with some embodiments. Therefore, the shallow recesses R2' are formed in the portion of the nanostructure stack 120B close to the intersection point C2, in accordance with some embodiments. As shown in FIGS. 2C-2 and 2C-3, the depth $D_{R2'}$ of the shallow recesses R2' is less than the depth $D_{R2}$ of the recesses R2, in accordance with some embodiments.

The depth $D_{R2'}$ ranges from about 1 nm to about 3 nm, in accordance with some embodiments. The depth $D_{R2}$ ranges from about 4 nm to about 10 nm, in accordance with some embodiments. The removal process includes an etching process such as a dry etching process or a wet etching process, in accordance with some embodiments.

As shown in FIGS. 2C-1, 2C-2, and 2C-3, an inner spacer layer 170 is formed in the recesses R1, R2, and R3 of the nanostructure stacks 120A, 120B, and 120C, and a thin inner spacer layer 170' is formed in the shallow recesses R2' of the nanostructure stack 120B, in accordance with some embodiments. The thin inner spacer layer 170' is thinner than the gate spacer 160, in accordance with some embodiments. The thin inner spacer layer 170' is thinner than the inner spacer layer 170, in accordance with some embodiments.

That is, the thickness T170' of the thin inner spacer layer 170' is less than the thickness T170 of the inner spacer layer 170, in accordance with some embodiments. The thickness T170' ranges from about 1 nm to about 3 nm, in accordance with some embodiments. The thickness T170 ranges from about 4 nm to about 10 nm, in accordance with some embodiments.

The inner spacer layer 170 is in direct contact with the nanostructure stacks 120A, 120B, and 120C, in accordance with some embodiments. The thin inner spacer layer 170' is in direct contact with the nanostructure stack 120B, in accordance with some embodiments.

As shown in FIGS. 2C-1, 2C-2, and 2C-3, the sidewalls of the inner spacer layer 170 are substantially aligned with (or substantially coplanar with) the sidewalls of the gate spacer 160 thereover, in accordance with some embodiments. The sidewalls of the thin inner spacer layer 170' are substantially aligned with (or substantially coplanar with) the sidewalls of the gate spacer 160 thereover, in accordance with some embodiments.

The inner spacer layer 170 and the thin inner spacer layer 170' are made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments.

In some embodiments, the inner spacer layer 170 and the thin inner spacer layer 170' are formed using a deposition process and an etching process. The deposition process includes a physical vapor deposition process, a chemical vapor deposition process, an atomic layer deposition process, or the like, in accordance with some embodiments. In some other embodiments, the inner spacer layer 170 and the thin inner spacer layer 170' are formed using a selective deposition process such as an atomic layer deposition process.

As shown in FIGS. 2D, 2D-1, 2D-2, and 2D-3, source/drain structures 180A are formed in left two of the trenches R, in accordance with some embodiments. The nanostructures 122, 124, 126 and 128 of the nanostructure stack 120A and the upper portion U1 of the bottom part 114 are between the source/drain structures 180A, in accordance with some embodiments.

The source/drain structures 180A are in direct contact with the nanostructures 122, 124, 126 and 128 of the nanostructure stack 120A, the gate spacer 160, the inner spacer layer 170, the thin inner spacer layer 170', and the bottom part 114, in accordance with some embodiments. The source/drain structures 180A are also referred to as stressor structures, in accordance with some embodiments.

In some embodiments, the source/drain structures 180A are made of a semiconductor material and N-type dopants. The source/drain structures 180A are in-situ doped with or implanted with N-type dopants, in accordance with some embodiments. The N-type dopants include the Group VA element, in accordance with some embodiments. The Group VA element includes phosphor (P), antimony (Sb), or another suitable Group VA material.

In some embodiments, a concentration of the Group VA element ranges from about 1E20 atoms/cm$^3$ to about 5E20 atoms/cm$^3$. In some embodiments, the atomic percentage of the Group VA element in the source/drain structures 180A ranges from about 1% to about 5%. The source/drain structures 180A are also referred to as doped structures, in accordance with some embodiments.

In some embodiments, the source/drain structures 180A are made of a semiconductor material (e.g., silicon germanium) with P-type dopants, such as the Group IIIA element, in accordance with some embodiments. The Group IIIA element includes boron or another suitable material. The source/drain structures 180A are formed using an epitaxial process, in accordance with some embodiments.

As shown in FIGS. 2D, 2D-1, and 2D-2, source/drain structures 180C are formed in right two of the trenches R, in accordance with some embodiments. The nanostructures 122, 124, 126 and 128 of the nanostructure stack 120C and the upper portion U3 of the bottom part 114 are between the source/drain structures 180C, in accordance with some embodiments.

The source/drain structures 180C are in direct contact with the nanostructures 122, 124, 126 and 128 of the nanostructure stack 120C, the gate spacer 160, the inner spacer layer 170, the inner spacer layer 170', and the bottom part 114, in accordance with some embodiments.

In some embodiments, the source/drain structures 180C are made of a semiconductor material and N-type dopants. The source/drain structures 180C are in-situ doped with or implanted with N-type dopants, in accordance with some embodiments. The N-type dopants include the Group VA element, in accordance with some embodiments. The Group VA element includes phosphor (P), antimony (Sb), or another suitable Group VA material.

In some embodiments, a concentration of the Group VA element ranges from about 1E20 atoms/cm3 to about 5E20 atoms/cm3. In some embodiments, the atomic percentage of the Group VA element in the source/drain structures 180C ranges from about 1% to about 5%. The source/drain structures 180C are also referred to as doped structures, in accordance with some embodiments.

In some embodiments, the source/drain structures 180C are made of a semiconductor material (e.g., silicon germanium) with P-type dopants, such as the Group IIIA element, in accordance with some embodiments. The Group IIIA element includes boron or another suitable material.

The source/drain structures 180C are formed using an epitaxial process, in accordance with some embodiments. In some embodiments, the source/drain structures 180A and 180C are formed in the same epitaxial process.

In some other embodiments, the source/drain structures 180A and 180C are formed in different epitaxial processes. The source/drain structures 180A are covered by a mask layer (not shown) during the formation of the source/drain structures 180C, and the mask layer is removed after the formation of the source/drain structures 180C, in accordance with some embodiments.

As shown in FIGS. 2D, 2D-1, 2D-2, and 2D-3, a dielectric layer 190 is formed over the source/drain structures 180A and 180C and the isolation layer 130, in accordance with some embodiments. The dielectric layer 190 surrounds the gate stacks 140A, 140B, and 140C, in accordance with some embodiments.

The dielectric layer 190 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 190 is formed by a deposition process (e.g., a chemical vapor deposition process) and a planarization process (e.g., a chemical mechanical polishing process), in accordance with some embodiments.

As shown in FIGS. 2E, 2E-1, 2E-2, and 2E-3, a mask layer M is formed over the dielectric layer 190, the gate spacer 160, and the gate stacks 140A and 140C, in accordance with some embodiments. The mask layer M has an opening OP, in accordance with some embodiments.

The opening OP exposes the mask layer 150 over the gate stack 140B, the gate spacer 160, and a portion of the dielectric layer 190, in accordance with some embodiments. The mask layer M is made of a polymer material (e.g., a photoresist material), nitrides (e.g., silicon nitride), or oxynitride (e.g., silicon oxynitride), in accordance with some embodiments.

As shown in FIGS. 2F, 2F-1, 2F-2, and 2F-3, the mask layer 150 over the gate stack 140B, the gate stack 140B, and the nanostructure stack 120B are removed through the opening OP of the mask layer M, in accordance with some embodiments. The removal process forms a trench A1 in the dielectric layer 190 and between the source/drain structures 180A and 180C, in accordance with some embodiments. The trench A1 exposes the gate spacer 160, the thin inner spacer layer 170', and the inner spacer layer 170 over the width-transition portion TR, in accordance with some embodiments.

As shown in FIG. 2F-1, after the removal process, a top surface STR of the width-transition portion TR is lower than a top surface SNR of the narrow portion NR, in accordance with some embodiments. The top surface STR of the width-transition portion TR is lower than a top surface SWR of the wide portion WR, in accordance with some embodiments.

As shown in FIGS. 2G, 2G-1, 2G-2, and 2G-3, a dielectric dummy gate 210 is formed in the trench A1, in accordance with some embodiments. The trench A1 is filled with the dielectric dummy gate 210, in accordance with some embodiments. The dielectric dummy gate 210 is in direct contact with the gate spacer 160, the inner spacer layer 170, the thin inner spacer layer 170', and the bottom part 114, in accordance with some embodiments.

The gate spacer 160 is embedded in the dielectric dummy gate 210, in accordance with some embodiments. The gate spacer 160 embedded in the dielectric dummy gate 210 is also referred to as a dummy gate spacer, in accordance with some embodiments. The inner spacer layer 170 and the thin inner spacer layer 170' are embedded in the dielectric dummy gate 210, in accordance with some embodiments.

FIG. 2G-4 is a cross-sectional view illustrating the semiconductor device structure along a sectional line in FIG. 2G, in accordance with some embodiments. As shown in FIG. 2G-4, the dielectric dummy gate 210 is wrapped around the upper portion of the bottom part 114, in accordance with some embodiments. As shown in FIGS. 2G and 2G-1, the mask layer M is removed, in accordance with some embodiments.

As shown in FIGS. 2H, 2H-1, 2H-2, and 2H-3, the gate stacks 140A and 140C and the mask layer 150 thereover are removed, in accordance with some embodiments. The removal process forms a trench A2 in the gate spacer 160 and the dielectric layer 190 and between the source/drain structures 180A, in accordance with some embodiments. The removal process forms a trench A3 in the gate spacer 160 and the dielectric layer 190 and between the source/drain structures 180C, in accordance with some embodiments.

As shown in FIGS. 2H, 2H-1, 2H-2, and 2H-3, the nanostructures 121, 123, 125, and 127 of the nanostructure stacks 120A and 120C are removed through the trenches A2 and A3, in accordance with some embodiments. The removal process for removing the gate stacks 140A and 140C, the mask layer 150, and the nanostructures 121, 123, 125, and 127 includes an etching process such as a wet etching process or a dry etching process, in accordance with some embodiments.

Since the dielectric dummy gate 210 and the gate stacks 140A and 140C are made of different materials, the dielectric dummy gate 210 remains after the removal process, in accordance with some embodiments. The dielectric dummy gate 210 prevents the etchant used in the removal process from flowing into the trench A1 and etching through the thin inner spacer layer 170', in accordance with some embodiments.

Since the dielectric dummy gate 210 covers the thin inner spacer layer 170', the dielectric dummy gate 210 protects the source/drain structures 180A and 180C beside the thin inner spacer layer 170' from being etched when removing the gate stacks 140A and 140C by an etching process, in accordance with some embodiments. Therefore, the formation of the dielectric dummy gate 210 improves the yield of the removal process of the gate stacks 140A and 140C, in accordance with some embodiments.

As shown in FIGS. 2I-1, 2I-2, and 2I-3, a gate dielectric layer 220 is formed over the nanostructures 122, 124, 126, and 128 of the nanostructure stacks 120A and 120C, the bottom part 114, the gate spacer 160, the inner spacer layer 170, and the dielectric layer 190, in accordance with some embodiments.

The gate dielectric layer 220 conformally covers the nanostructures 122, 124, 126, and 128 of the nanostructure stacks 120A and 120C, the bottom part 114, the gate spacer 160, the inner spacer layer 170, and the dielectric layer 190, in accordance with some embodiments. The gate dielectric layer 220 surrounds the nanostructures 122, 124, 126, and 128 of the nanostructure stacks 120A and 120C, in accordance with some embodiments.

The gate dielectric layer 220 is made of a high-K material, such as $HfO_2$, $La_2O_3$, $CaO$, $ZrO_2$, $HfZrO_2$, or $Al_2O_3$, in accordance with some embodiments. The gate dielectric layer 220 is formed using an atomic layer deposition process or another suitable process.

As shown in FIGS. 2I-1, 2I-2, and 2I-3, a work function metal layer 230 is conformally formed over the gate dielectric layer 220, in accordance with some embodiments. The work function metal layer 230 provides a desired work function for transistors to enhance device performance including improved threshold voltage.

In the embodiments of forming an NMOS transistor, the work function metal layer 230 can be a metal capable of providing a work function value suitable for the device, such as equal to or less than about 4.5 eV.

The work function metal layer 230 is made of metal, metal carbide, metal nitride, or a combination thereof, in accordance with some embodiments. For example, the work function metal layer 230 is made of tantalum, hafnium carbide, zirconium carbide, tantalum nitride, or a combination thereof.

In the embodiments of forming a PMOS transistor, the work function metal layer 230 can be a metal capable of providing a work function value suitable for the device, such as equal to or greater than about 4.8 eV.

The work function metal layer 230 is made of metal, metal carbide, metal nitride, another suitable material, or a combination thereof, in accordance with some embodiments. For example, the work function metal layer 230 is made of titanium, titanium nitride, another suitable material, or a combination thereof.

The work function metal layer 230 is formed using a deposition process, in accordance with some embodiments. The deposition process includes a physical vapor deposition process, a chemical vapor deposition process, an atomic layer deposition process, or a combination thereof, in accordance with some embodiments.

As shown in FIGS. 2I, 2I-1, 2I-2, and 2I-3, a gate electrode material layer 240a is formed over the work function metal layer 230, in accordance with some embodiments. The trenches A2 and A3 and gaps GA between the bottom part 114 and the nanostructures 122, 124, 126, and 128 are completely filled with the gate electrode material layer 240a, in accordance with some embodiments.

The gate electrode material layer 240a is made of metal, metal nitride, or metal carbide, in accordance with some embodiments. The gate electrode material layer 240a is made of tungsten, titanium nitride, tantalum nitride, titanium aluminide, titanium carbide, or a combination thereof, in accordance with some embodiments.

The gate electrode material layer 240a is formed using an atomic layer deposition process, a chemical vapor deposition process, or a physical vapor deposition process, in accordance with some embodiments.

FIG. 2J-7 is a perspective view of the semiconductor device structure of FIG. 2J, in accordance with some embodiments. As shown in FIGS. 2J, 2J-1, 2J-2, 2J-3, and 2J-7, portions of the gate electrode material layer 240a, the gate dielectric layer 220, and the work function metal layer 230 outside of the trenches A2 and A3 are removed, in accordance with some embodiments.

In this step, a semiconductor device structure 200 is substantially formed, in accordance with some embodiments. The gate electrode material layer 240a remaining in the trenches A2 and A3 forms a gate electrode layer 240, in accordance with some embodiments.

FIG. 2J-4 is a cross-sectional view illustrating the semiconductor device structure along a sectional line IV-IV' in FIG. 2J, in accordance with some embodiments. As shown in FIGS. 2J, 2J-1, and 2J-4, the gate dielectric layer 220, the work function metal layer 230, and the gate electrode layer 240 remaining in the trench A2 together form a gate stack G1, in accordance with some embodiments.

The gate stack G1 surrounds the nanostructures 122, 124, 126, and 128 of the nanostructure stack 120A, in accordance with some embodiments. The gate stack G1 is wrapped around the wide portion WR of the fin FS, in accordance with some embodiments.

FIG. 2J-5 is a cross-sectional view illustrating the semiconductor device structure along a sectional line V-V' in FIG. 2J, in accordance with some embodiments. As shown in FIGS. 2J, 2J-1, and 2J-5, the dielectric dummy gate 210 surrounds the upper portion of the bottom part 114, in accordance with some embodiments. The dielectric dummy gate 210 wrapped around the width-transition portion TR of the fin FS, in accordance with some embodiments.

FIG. 2J-6 is a cross-sectional view illustrating the semiconductor device structure along a sectional line VI-VI' in FIG. 2J, in accordance with some embodiments. As shown in FIGS. 2J, 2J-1, and 2J-6, the gate dielectric layer 220, the work function metal layer 230, and the gate electrode layer 240 remaining in the trench A3 together form a gate stack G2, in accordance with some embodiments.

The gate stack G2 surrounds the nanostructures 122, 124, 126, and 128 of the nanostructure stack 120C, in accordance with some embodiments. The removal process includes a planarization process such as a chemical mechanical polishing process, in accordance with some embodiments.

In this step, transistors 100A and 100C are substantially formed, in accordance with some embodiments. The transistor 100A includes a NMOS transistor or a PMOS transistor, in accordance with some embodiments. The transistor 100C includes a NMOS transistor or a PMOS transistor, in accordance with some embodiments. The transistors 100A and 100C are gate-all-around (GAA) transistors, in accordance with some embodiments.

The transistor 100A includes the gate stack G1, the nanostructure stack 120A, the upper portion U1 of the bottom part 114, and the source/drain structures 180A, in accordance with some embodiments. The nanostructures 122, 124, 126, and 128 of the nanostructure stack 120A and the upper portion U1 of the bottom part 114 are channels of the transistor 100A, in accordance with some embodiments.

The transistor 100C includes the gate stack G2, the nanostructures 122, 124, 126 and 128 of the nanostructure stack 120C, the upper portion U3 of the bottom part 114, and the source/drain structures 180C, in accordance with some embodiments. The nanostructures 122, 124, 126 and 128 of the nanostructure stack 120C and the upper portion U3 are channels of the transistor 100C, in accordance with some embodiments.

As shown in FIG. 2J-1, the wide portion WR is thicker than the width-transition portion TR, in accordance with some embodiments. That is, the thickness $T_{WR}$ of the wide portion WR is greater than the thickness $T_{TR}$ of the width-transition portion TR, in accordance with some embodiments.

The narrow portion NR is thicker than the width-transition portion TR, in accordance with some embodiments. That is, the thickness $T_{NR}$ of the narrow portion NR is greater than the thickness $T_{TR}$ of the width-transition portion TR, in accordance with some embodiments.

The top surface $S_{G1}$ of the gate stack G1, the top surface $S_{G2}$ of the gate stack G2, the top surface 212 of the dielectric dummy gate 210, the top surface 192 of the dielectric layer 190, the top surface 162 of the gate spacer 160 are substantially level with each other, in accordance with some embodiments.

The dielectric dummy gate 210 is wider than the gate stack G1 or G2, in accordance with some embodiments. That is, the width W210 is greater than the width $W_G$ of the gate stack G1 or G2, in accordance with some embodiments.

Elements designated by the same reference numbers as those in FIGS. 1A to 2J-7 have structures and materials that are the same or similar. Therefore, the detailed descriptions thereof will not be repeated herein.

In accordance with some embodiments, semiconductor device structures and methods for forming the same are provided. The methods (for forming the semiconductor device structure) form a dielectric dummy gate over a width-transition portion of a fin to covers a thin inner spacer layer. During removing poly gate stacks, the dielectric dummy gate remains to cover the thin inner spacer layer, which prevents the etchant used in the removal process from flowing into a trench, which exposes the thin inner spacer layer, and etching through the thin inner spacer layer.

Since the dielectric dummy gate covers the thin inner spacer layer, the dielectric dummy gate protects source/drain structures beside the thin inner spacer layer from being etched when removing the gate stacks by an etching process. Therefore, the formation of the dielectric dummy gate improves the yield of the removal process of the gate stacks.

In accordance with some embodiments, a semiconductor device structure is provided. The semiconductor device structure includes a substrate having a base and a fin over the base. The fin has a wide portion and a width-transition portion, the width-transition portion tapers away from the wide portion in a top view of the substrate, and a first top surface of the wide portion is higher than a second top surface of the width-transition portion. The semiconductor device structure includes a gate stack wrapped around the wide portion. The semiconductor device structure includes a dielectric dummy gate wrapped around the width-transition portion.

In accordance with some embodiments, a semiconductor device structure is provided. The semiconductor device structure includes a substrate having a base and a fin over the base. The fin has a narrow portion and a width-transition portion, the width-transition portion tapers toward the narrow portion in a top view of the substrate, and a first top surface of the width-transition portion is lower than a second top surface of the narrow portion. The semiconductor device structure includes a gate stack wrapped around the narrow portion. The semiconductor device structure includes a dielectric dummy gate wrapped around the width-transition portion.

In accordance with some embodiments, a method for forming a semiconductor device structure is provided. The method includes providing a substrate having a base and a fin over the base. The fin has a wide portion and a width-transition portion, and the width-transition portion tapers away from the wide portion in a top view of the substrate. The method includes forming a first gate stack and a second gate stack respectively wrapped around the wide portion and the width-transition portion. The method includes forming a dielectric layer over the base and surrounding the first gate stack and the second gate stack. The method includes removing the second gate stack and the width-transition portion originally wrapped by the second gate stack to form a trench in the dielectric layer. The method includes forming a dielectric dummy gate in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a substrate having a base and a fin over the base, wherein the fin has a wide portion and a width-transition portion, and the width-transition portion tapers away from the wide portion in a top view of the substrate;
   forming a first gate stack and a second gate stack respectively wrapped around the wide portion and the width-transition portion, wherein the second gate stack has a first sidewall and a second sidewall opposite to the first sidewall, the first sidewall faces the first gate stack, a width of the width-transition portion continuously decreases from the first sidewall to the second sidewall, and the width is measured along a longitudinal axis of the second gate stack in a top view of the substrate, the first gate stack, and the second gate stack;
   forming a dielectric layer over the base and surrounding the first gate stack and the second gate stack;
   removing the second gate stack and the width-transition portion originally wrapped by the second gate stack to form a trench in the dielectric layer; and
   forming a dielectric dummy gate in the trench.

2. The method for forming the semiconductor device structure as claimed in claim 1, wherein the width-transition portion has a bottom part and a nanostructure over the bottom part, the second gate stack is over the bottom part and wrapped around the nanostructure, and
   the removing of the second gate stack and the width-transition portion originally wrapped by the second gate stack comprises:
   removing the second gate stack and the nanostructure.

3. The method for forming the semiconductor device structure as claimed in claim 1, wherein the trench is filled with the dielectric dummy gate.

4. The method for forming the semiconductor device structure as claimed in claim 1, further comprising:
   forming a gate spacer over a sidewall of the second gate stack before forming the dielectric layer over the base and surrounding the first gate stack and the second gate stack, wherein the gate spacer is embedded in the dielectric dummy gate after forming the dielectric dummy gate in the trench.

5. The method for forming the semiconductor device structure as claimed in claim 1, wherein the wide portion has a bottom part and a nanostructure over the bottom part, and the first gate stack is over the bottom part and wrapped around the nanostructure.

6. The method for forming the semiconductor device structure as claimed in claim 1, wherein the width-transition portion has a trapezoid shape in the top view of the substrate.

7. The method for forming the semiconductor device structure as claimed in claim 1, wherein a first top surface of the dielectric dummy gate is higher than a second top surface of the wide portion.

8. The method for forming the semiconductor device structure as claimed in claim 7, wherein the second top surface of the wide portion is higher than a bottom surface of the dielectric dummy gate.

9. The method for forming the semiconductor device structure as claimed in claim 4, wherein the dielectric dummy gate is in direct contact with a sidewall and a bottom surface of the gate spacer.

10. The method for forming the semiconductor device structure as claimed in claim 2, wherein the dielectric dummy gate is wrapped around the bottom part of the width-transition portion of the fin.

11. A method for forming a semiconductor device structure, comprising:
providing a substrate having a base and a fin over the base, wherein the fin has a wide portion and a width-transition portion, the width-transition portion is narrower than the wide portion, the fin has a bottom part, a first nanostructure, and a second nanostructure, and the first nanostructure is between the bottom part and the second nanostructure;
forming a first gate stack and a second gate stack respectively wrapped around the wide portion and the width-transition portion, wherein portions of the fin are exposed by the first gate stack and a second gate stack;
removing the portions of the fin, wherein after the portions of the fin are removed, the first nanostructure and the second nanostructure remaining under the first gate stack together form a first nanostructure stack, and the first nanostructure and the second nanostructure remaining under the second gate stack together form a second nanostructure stack;
partially removing the first nanostructure of the first nanostructure stack and the first nanostructure of the second nanostructure stack to form a first recess in the first nanostructure stack and a second recess in the second nanostructure stack;
forming a first inner spacer and a second inner spacer in the first recess and the second recess respectively;
forming a dielectric layer over the base and surrounding the first gate stack and the second gate stack;
removing the second gate stack and the second nanostructure stack to form a trench in the dielectric layer; and
forming a dielectric dummy gate in the trench, wherein the trench is filled with the dielectric dummy gate, and the entire dielectric dummy gate is a single-layer structure.

12. The method for forming the semiconductor device structure as claimed in claim 11, wherein the first inner spacer is thicker than the second inner spacer.

13. The method for forming the semiconductor device structure as claimed in claim 11, further comprising:
forming a gate spacer over a sidewall of the second gate stack before removing the portions of the fin, wherein the gate spacer is thicker than the second inner spacer.

14. The method for forming the semiconductor device structure as claimed in claim 13, wherein the gate spacer is embedded in the dielectric dummy gate.

15. The method for forming the semiconductor device structure as claimed in claim 14, wherein the second inner spacer is embedded in the dielectric dummy gate.

16. A method for forming a semiconductor device structure, comprising:
providing a substrate having a base and a fin over the base, wherein the fin has a wide portion and a width-transition portion, and the width-transition portion is narrower than the wide portion;
forming a first gate stack and a second gate stack respectively wrapped around the wide portion and the width-transition portion;
forming a gate spacer over a sidewall of the second gate stack;
forming a dielectric layer over the base and surrounding the first gate stack and the second gate stack;
removing the second gate stack and the width-transition portion originally wrapped by the second gate stack to form a trench in the dielectric layer; and
forming a dielectric dummy gate in the trench, wherein the dielectric dummy gate has an upper portion and a lower portion, the upper portion is surrounded by the gate spacer, the lower portion is under the upper portion and the gate spacer, the lower portion is wider than the upper portion, the trench is filled with the dielectric dummy gate, and the entire dielectric dummy gate is made of a dielectric material.

17. The method for forming the semiconductor device structure as claimed in claim 16, wherein the lower portion of the dielectric dummy gate covers a bottom surface of the gate spacer.

18. The method for forming the semiconductor device structure as claimed in claim 16, wherein the dielectric dummy gate has a bottom portion under the lower portion, and the lower portion is wider than the bottom portion.

19. The method for forming the semiconductor device structure as claimed in claim 16, wherein a first top surface of the dielectric dummy gate is substantially level with a second top surface of the first gate stack.

20. The method for forming the semiconductor device structure as claimed in claim 16, wherein the dielectric dummy gate is wider than the first gate stack.

* * * * *